US011434697B2

(12) United States Patent
Chen

(10) Patent No.: US 11,434,697 B2
(45) Date of Patent: Sep. 6, 2022

(54) PREDICTION OF CUTTING SIZE AND SHAPE GENERATED BY A DRILL BIT

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 401 days.

(21) Appl. No.: 16/493,362

(22) PCT Filed: Jun. 21, 2017

(86) PCT No.: PCT/US2017/038607
§ 371 (c)(1),
(2) Date: Sep. 12, 2019

(87) PCT Pub. No.: WO2018/236373
PCT Pub. Date: Dec. 27, 2018

(65) Prior Publication Data
US 2020/0102792 A1   Apr. 2, 2020

(51) Int. Cl.
*E21B 10/26* (2006.01)
*E21B 10/43* (2006.01)
(Continued)

(52) U.S. Cl.
CPC .............. *E21B 10/43* (2013.01); *E21B 10/26* (2013.01); *E21B 10/55* (2013.01); *E21B 10/62* (2013.01); *E21B 44/00* (2013.01)

(58) Field of Classification Search
CPC .......... E21B 10/26; E21B 10/43; E21B 10/55; E21B 10/62; E21B 41/00; E21B 44/00; E21B 2200/20
See application file for complete search history.

(56) References Cited

U.S. PATENT DOCUMENTS

2005/0015229 A1\* 1/2005 Huang ................... G06F 30/17
703/10
2011/0094800 A1   4/2011 Krohn et al.
(Continued)

OTHER PUBLICATIONS

International Search Report and The Written Opinion of the International Search Authority, or the Declaration, dated Mar. 19, 2018, PCT/US2017/038607, 16 pages, ISA/KR.

*Primary Examiner* — Daniel P Stephenson
(74) *Attorney, Agent, or Firm* — Haynes and Boone, LLP

(57) ABSTRACT

Methods for simulating a downhole drilling operation include estimating the geometry, i.e., the shape, size of rock chips generated by engagement of a drill bit with a geologic formation. Each cutting element on the drill bit may produce rock chips of different geometry, and the geometry of rock chips generated by a particular cutting element may change over a predetermined interval. The geometry and other properties rock chips predicted for an interval may be recorded, and a distribution may be calculated based on categorizing each of the predicted rock chips into predefined categories and determining the relative number of rock chips in each category. The distribution may be useful in drill bit design, determining required mud flow characteristics for a drilling operation, and facilitating rotation of a drill string by preventing undesirable interactions of the rock chips with the drill bit and other downhole equipment.

20 Claims, 15 Drawing Sheets

(51) Int. Cl.
    *E21B 10/55*     (2006.01)
    *E21B 10/62*     (2006.01)
    *E21B 44/00*     (2006.01)

(56) References Cited

U.S. PATENT DOCUMENTS

| | | | |
|---|---|---|---|
| 2012/0111630 A1* | 5/2012 | Chen | E21B 10/55 175/45 |
| 2012/0152624 A1* | 6/2012 | Chen | E21B 10/55 175/428 |
| 2014/0110181 A1* | 4/2014 | Zhang | G06F 30/23 703/2 |
| 2014/0333754 A1 | 11/2014 | Graves et al. | |
| 2015/0114714 A1 | 4/2015 | Dahl et al. | |
| 2016/0245048 A1 | 8/2016 | Jamison et al. | |
| 2017/0016307 A1 | 1/2017 | Chen | |
| 2017/0058613 A1* | 3/2017 | Ling | E21B 10/42 |
| 2020/0095859 A1* | 3/2020 | Chen | E21B 44/04 |
| 2020/0102792 A1* | 4/2020 | Chen | E21B 10/26 |
| 2020/0115963 A1* | 4/2020 | Chen | E21B 10/43 |

\* cited by examiner

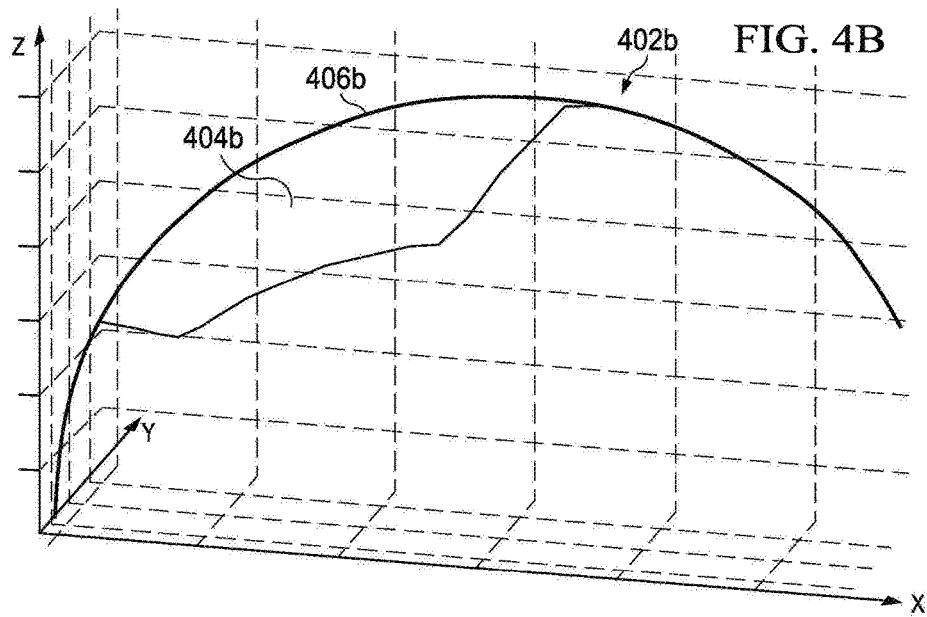
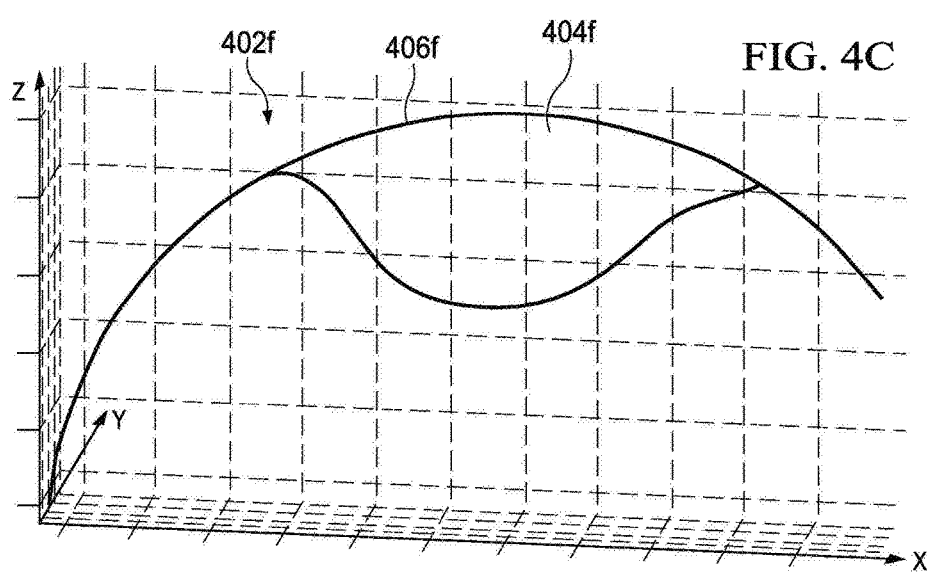

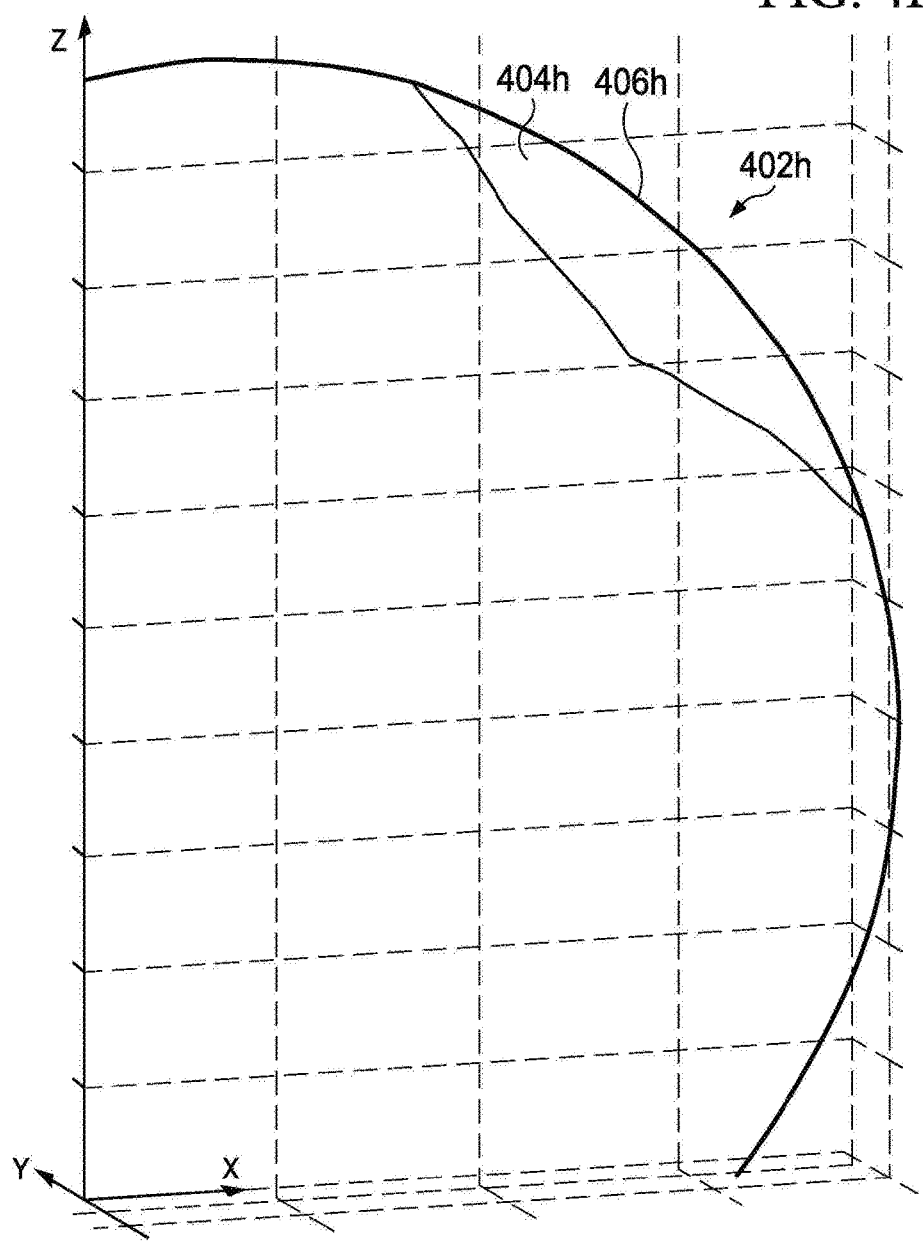

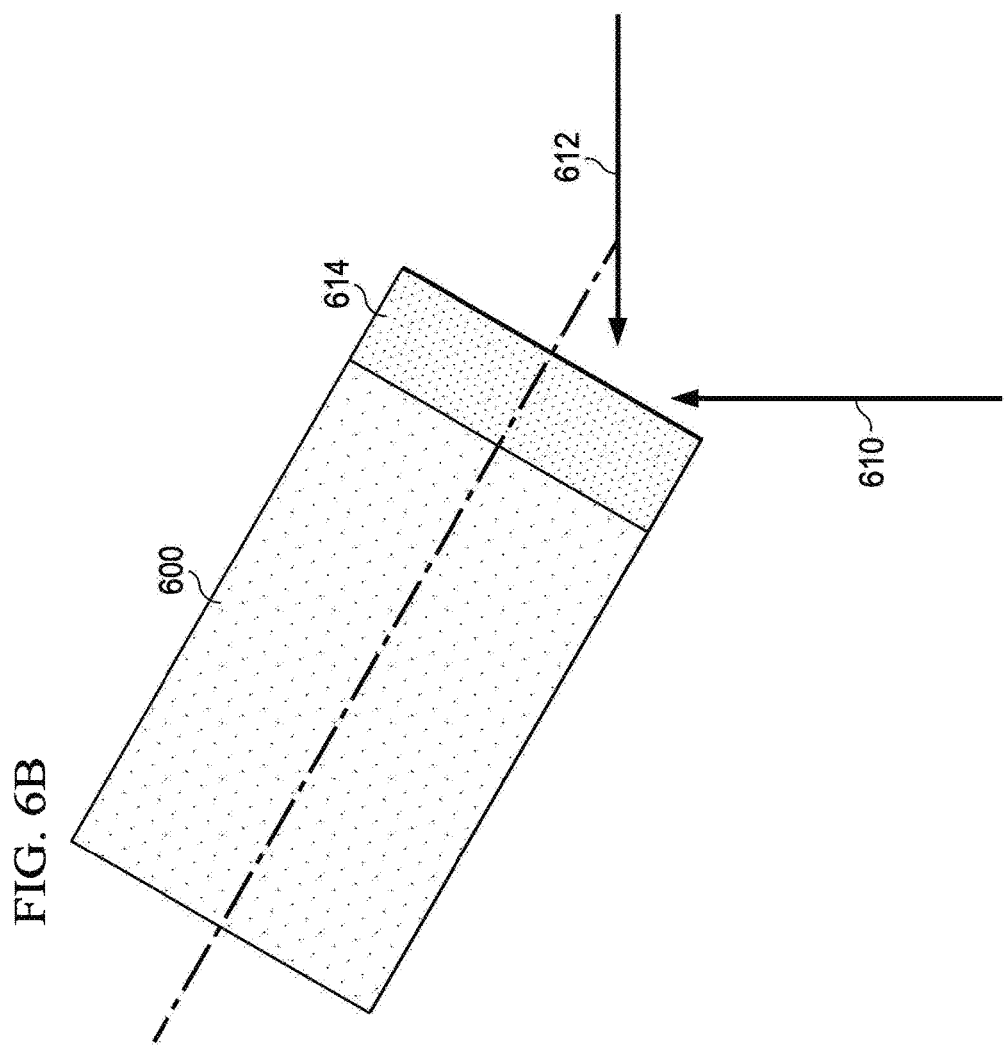

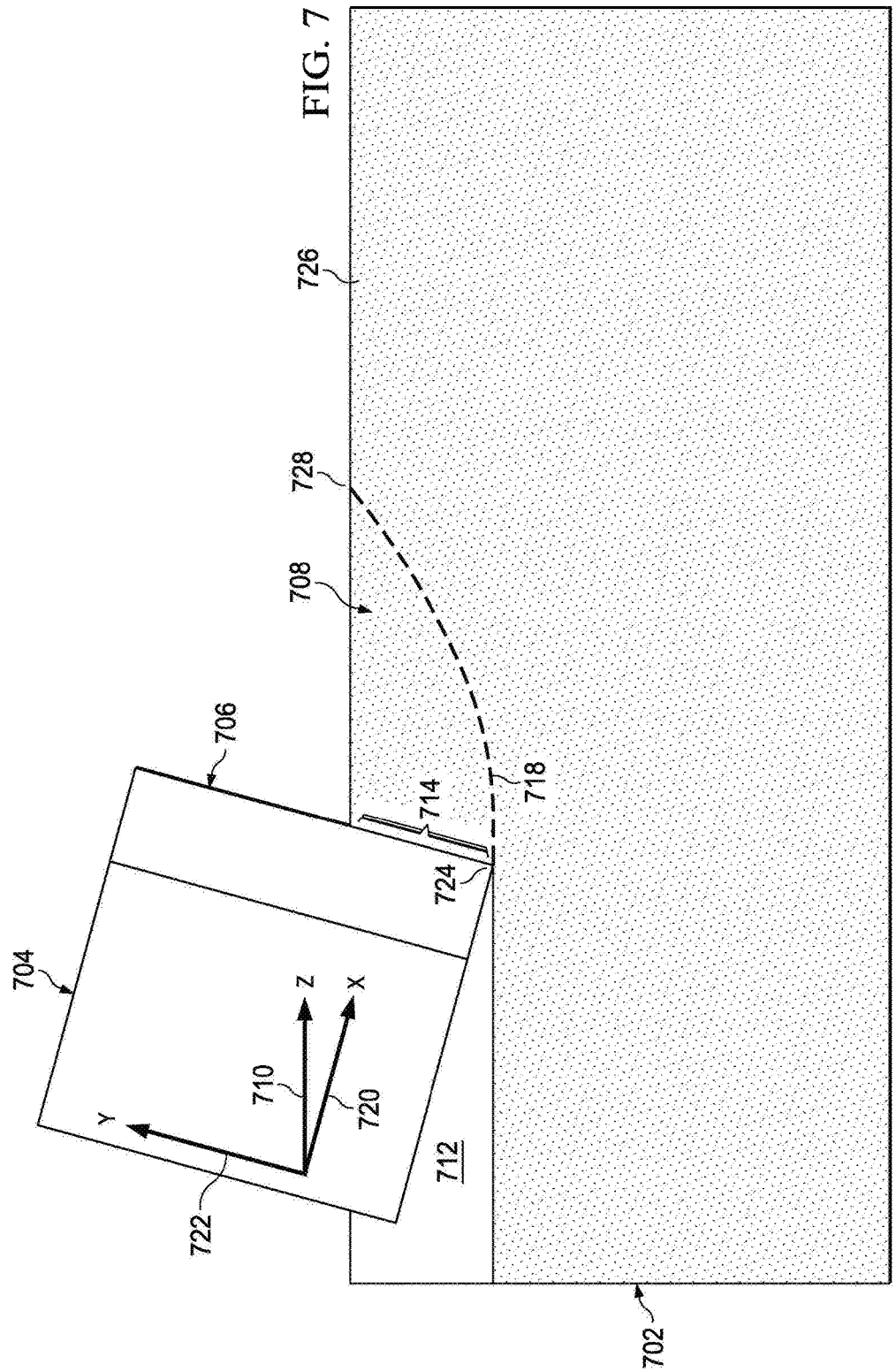

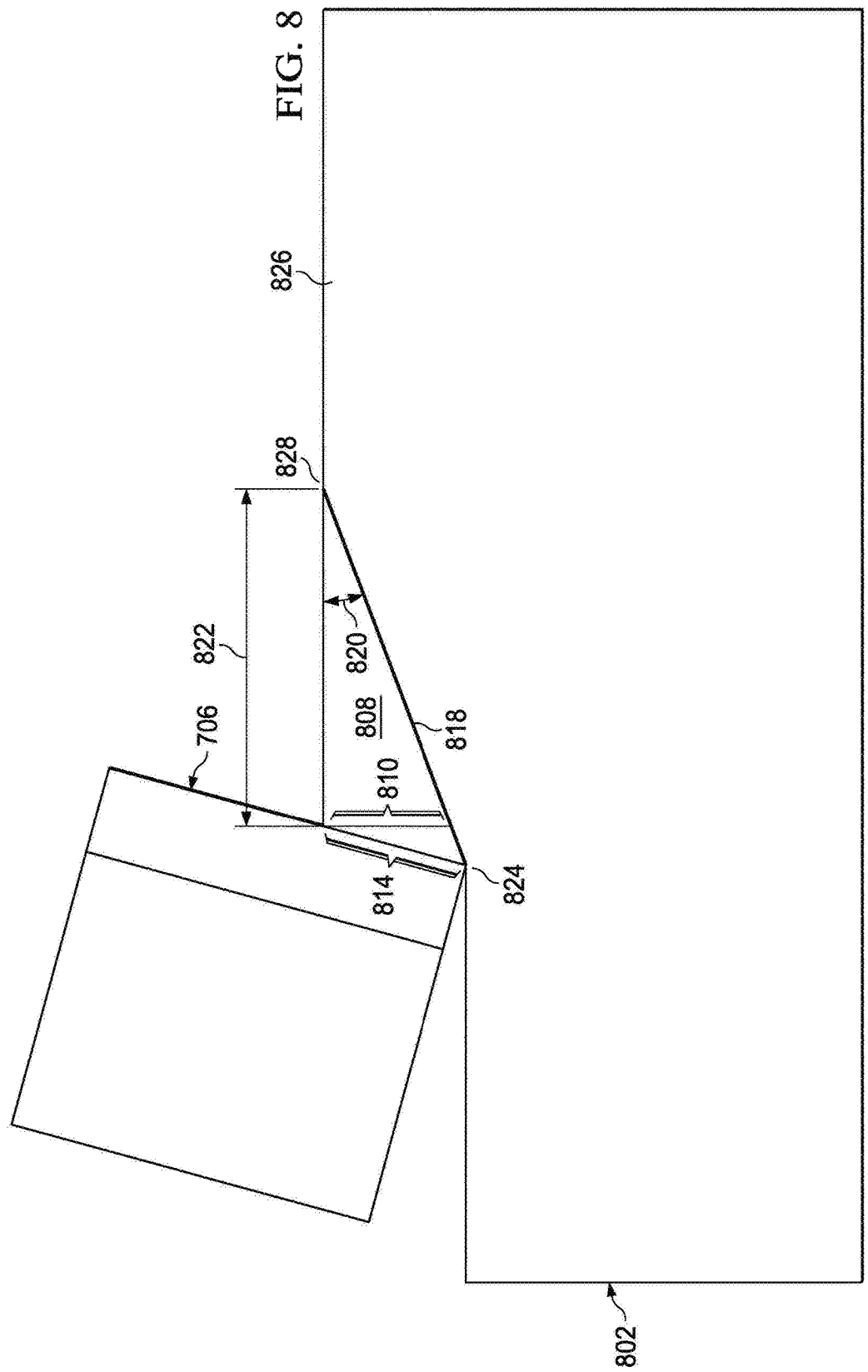

PREDICTION OF CUTTING SIZE AND SHAPE GENERATED BY A DRILL BIT

CROSS REFERENCE TO RELATED APPLICATION(S)

The present application is a U.S. National Stage patent application of International Patent Application No. PCT/US2017/038607, filed on Jun. 21, 2017, the disclosure of which is hereby incorporated by reference in its entirety.

BACKGROUND

Various types of downhole drilling tools including, but not limited to, rotary drill bits, reamers, and core bits, have been used to form wellbores in associated geologic formations, e.g., for forming oil and gas wells. One type of rotary drill bits that may be used in downhole drilling are fixed cutter drill bits, which are often referred to as drag bits. A bit body for a fixed-cutter drill bit may be constructed of a metallic material such as steel or a matrix material, and fixed cutting elements such as polycrystalline diamond compact (PDC) can be affixed to an outer profile of the bit body. Fixed cutter drill bits, such as PDC drill bits, may include multiple blades that each include multiple cutting elements supported thereon. In typical drilling applications, geologic formations may generally have a relatively low compressive strength in the upper portions (e.g., at lesser drilling depths) and a relatively high compressive strength in the lower portions (e.g., at greater drilling depths). Thus, it typically becomes increasingly difficult to drill at increasingly greater depths. Also, different drill bits may be selected as a function of drilling depth since the compressive strength of the formation may be a factor in drill bit selection.

The compressive strength of the geologic formation may be one factor in selecting or designing a drill bit for use in a drilling operation. The drill bit design, the properties of the geologic formation and operational parameters (weight-on-bit, bit rotation speed, etc.) can all affect the size and shape of the rock chips generated. By effectively predicting the size and shape of rock chips of a drilling operation, the efficiency of a drilling operation may be controlled and improved.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

FIGS. 4A through 4D are sectional views of cutting elements disposed along a blade profile illustrating cutting zones of the various cutting elements.

FIG. 6B is a cross sectional view of the cutting element of FIG. 6A illustrating operational forces applied to the cutting element.

FIG. 7 is a cross sectional view of an exemplary cutting element engaged with geologic formation 702.

FIG. 8 is a cross-sectional view of an approximation of a rock chip in simplified form illustrating a useful model for a rock chip.

DETAILED DESCRIPTION

The present disclosure is directed to systems and methods for predicting or estimating a distribution of cuttings, e.g., rock chips, generated by engagement of a drill bit with a geologic formation in a drilling operation. The distribution may be calculated based on categorizing each of the predicted rock chips into predefined categories, e.g., categories according size, shape or other properties of predicted rock chip models, and determining the relative number of rock chips in each category. Each cutting element on the drill bit may produce rock chips having different properties, and the properties of the rock chips generated by a particular cutting element may change over a drilling interval. The properties of all the rock chips predicted over a predetermined interval may be recorded. The recorded rock chips may be categorized by size, shape, weight or other geometric characteristics such as chip length, chip height, volume, and a modeled rock chip angle. A distribution of the predicted rock chips among the categories may then be determined. The distribution of the estimated rock chips may be useful in drill bit design, determining required mud flow characteristics for a particular drilling operation, and facilitating rotation of a drill string by preventing undesirable interactions of the rock chips with the drill bit, a drill pipe or other downhole equipment in operation.

Figure 1:
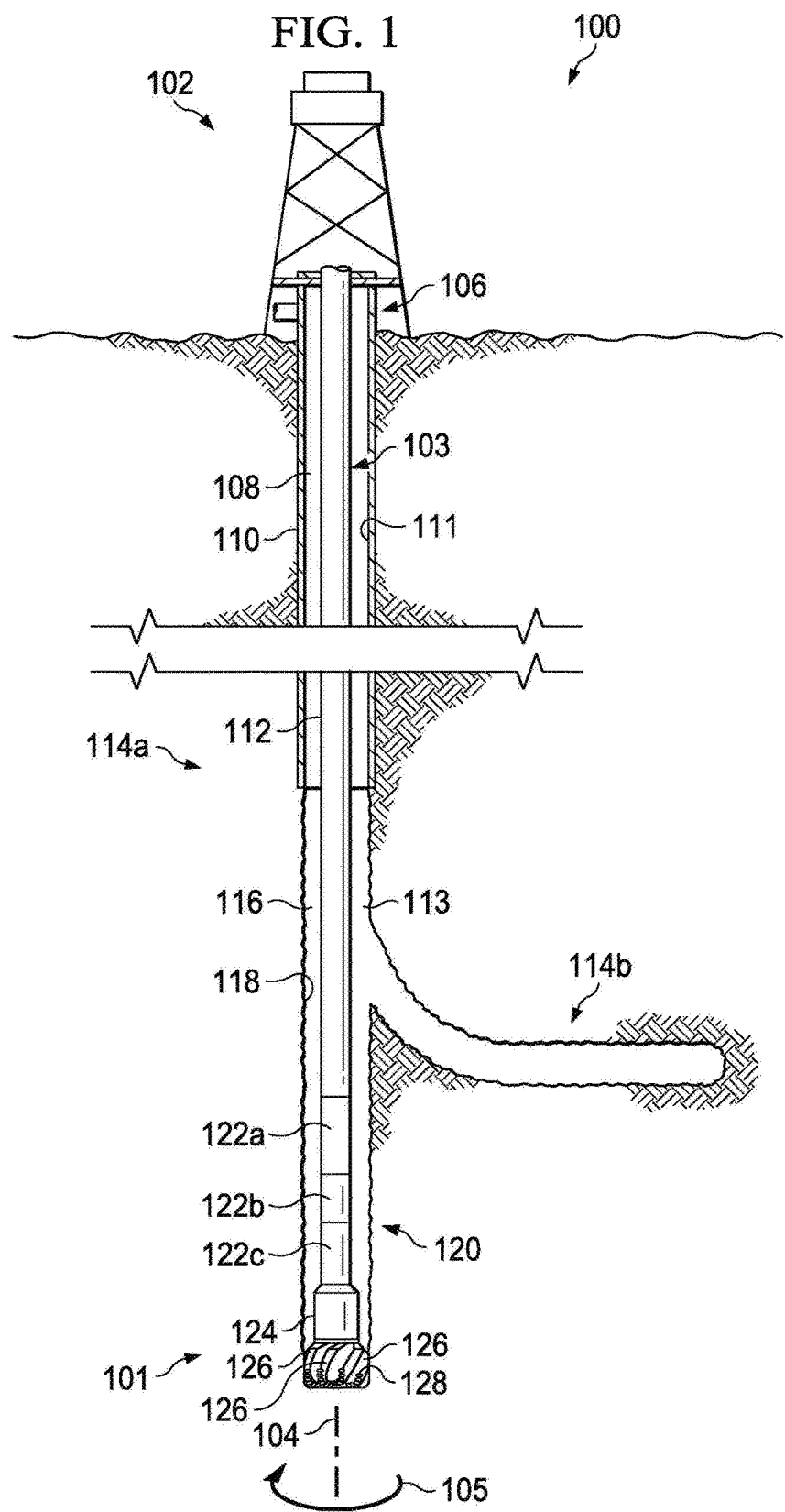
FIG. 1 is an elevation view of a drilling system including a rotary drill bit for drilling a wellbore in accordance with some embodiments of the present disclosure.

FIG. 1 is an elevation view of a drilling system 100 including a rotary drill bit 101 for drilling wellbores 114a, 114b (generally or collectively wellbore 114) in accordance with some embodiments of the present disclosure. Drilling system 100 may include a well site at a surface location 106. Various types of drilling equipment such as a rotary table, drilling fluid pumps and drilling fluid tanks (not expressly shown) may be located at the surface location 106. For example, a drilling rig 102 may be provided with various features associated with terrestrial drilling operations with a "land drilling rig." However, teachings of the present disclosure may be satisfactorily applied in offshore drilling operations, e.g., operations with drilling equipment located on offshore platforms, drill ships, semi-submersibles and drilling barges (not expressly shown).

Drilling system 100 may also include a drill string 103 associated with the drill bit 101 for forming a wide variety of wellbores 114 such as generally vertical wellbore 114a, generally horizontal wellbore 114b, and/or wellbores having any other orientation. Various directional drilling techniques and associated components of a bottom hole assembly (BHA) 120 coupled within the drill string 103 may be used to form deviated wellbores such as the horizontal wellbore 114b. For example, lateral forces may be applied to BHA 120 proximate kickoff location 113 to steer the drill bit 101 and form the generally horizontal wellbore 114b. The term "directional drilling" may be used to describe drilling a wellbore or portions of a wellbore that extend at a desired angle or angles relative to vertical. The desired angles may be greater than normal variations associated with vertical wellbores. Directional drilling may also be described as drilling any wellbore deviated from vertical.

BHA 120 may include a wide variety of components configured to form wellbore 114. For example, the BHA 120 may include the drill bit 101, and components 122a, 122b and 122c (generally or collectively components 122) coupled in the drill string 103 above the drill bit 101. The components 122 of the BHA 120 may include, but are not limited to, drill collars, rotary steering tools, directional drilling tools, downhole drilling motors, reamers, hole enlargers, stabilizers etc. The number and types of components 122 included in BHA 120 may depend on anticipated downhole drilling conditions and the type of wellbore 114 that will be formed by drill string 103 and rotary drill bit 101. BHA 120 may also include various types of well logging tools (not expressly shown) and other downhole tools associated with directional drilling of a wellbore. Examples of logging tools and/or directional drilling tools may include, but are not limited to, acoustic, neutron, gamma ray, density, photoelectric, nuclear magnetic resonance, rotary steering tools and/or any other commercially available well tool. Further, BHA 120 may also include a rotary drive (not expressly shown) connected to components 122 that rotates at least part of drill string 103, e.g., parts of the drill string including the drill bit 101 and the components 122.

Wellbore 114 may be defined in part by casing string 110 that may extend from surface location 106 to a selected downhole location. Portions of wellbore 114 illustrated in FIG. 1 that do not include casing string 110 may be described as "open hole." Various types of drilling fluid, or "mud," may be pumped from the surface location 106 through drill string 103. The drilling fluids may be expelled from the drill string 103 through nozzles (depicted as nozzles 156 in FIG. 2) passing through rotary drill bit 101. The drilling fluid may be circulated back to surface location 106 through an annulus 108, 116 defined between an outside diameter 112 of the drill string 103 and a surrounding structure. For example, an open hole annulus 116 is defined between the drill string 103 and an inside diameter 118 of the wellbore 114a. The inside diameter 118 may be referred to as the "sidewall" of the wellbore 114a. A cased annulus 108 may also be defined between the drill string 103 and an inside diameter 111 of the casing string 110.

The drill bit 101, discussed in further detail with reference to FIG. 2, may include one or more blades 126, with respective junk slots or fluid flow paths 140 disposed there between. The blades 126 may project or extend outwardly from exterior portions of a rotary bit body 124. Drill bit 101 may rotate with respect to bit rotational axis 104 in a direction defined by directional arrow 105. One or more cutting elements 128 may be disposed outwardly from exterior portions of each blade 126, and the blades 126 may also include one or more depth of cut controllers (not expressly shown) configured to control the depth of cut of cutting elements 128. The drill bit 101 may be designed and formed in accordance with teachings of the present disclosure and may have many different designs, configurations, and/or dimensions according to the particular application of drill bit 101.

The configuration, placement and orientation of cutting elements 128 on the drill bit 101 may contribute to the drilling efficiency of the drill bit 101 and the cuttings or rock chips that are generated by the drill bit 101 in operation. Cutting elements 128 may be laid out according to one of two general configurations: single-set and track-set. In a single-set configuration, each of cutting elements 128 on drill bit 101 may have a unique radial position with respect to the bit rotational axis 104. In a track-set configuration, at least two of the cutting elements 128 may have the same radial position with respect to the bit rotational axis 104. Generally, drill bits having cutting elements laid out in a single-set configuration may drill more efficiently than drill bits having a track-set configuration, while drill bits having cutting elements laid out in a track-set configuration may be more stable than drill bits having a single-set configuration.

In some embodiments, it may be advantageous to simulate interactions between the cutting elements 128 on the drill bit 101 (or another downhole drilling tools) and the geologic formation to determine a size, shape and distribution of rock chips that may be generated in operation. For example, during operation of drilling system 100, when drill bit 101 contacts the bottom of wellbore 114a or an end of horizontal wellbore 114b, blades 126 or cutting elements 128 may mechanically scrape the formations surrounding wellbores 114, causing pieces of rock to separate from the formations. In some embodiments, drill bit 101 may further cause rock chips to separate from the formations in advance of blades 126 or cutting elements 128. For a drilling operation that may include drilling into two or more different types of geologic formations, it may be advantageous to consider the size, shape, distribution and/or other characteristics of the rock chips generated by drilling through each type of geologic formation. In this way, a particular drilling operation may be optimized. For example, a drill bit, drilling fluid or other drilling tool may be selected from a group of available drilling tools for carrying out a drilling operation in through the particular geologic formations. In other embodiments, a drilling tool may be designed, e.g., by selecting a number, position, and orientation cutting elements 128, that is expected to produce a desired size, shape and distribution of rock chips in the drilling operation. Also operational parameters, e.g., rotational speed, weight on bit, mud flow rate, etc. may be selected to accommodate or produce a particular distribution of rock chips in generated in operation. A modeling system designed according to the present disclosure may improve accuracy of predictions of drilling efficiencies of downhole drilling tools.

Figure 2:
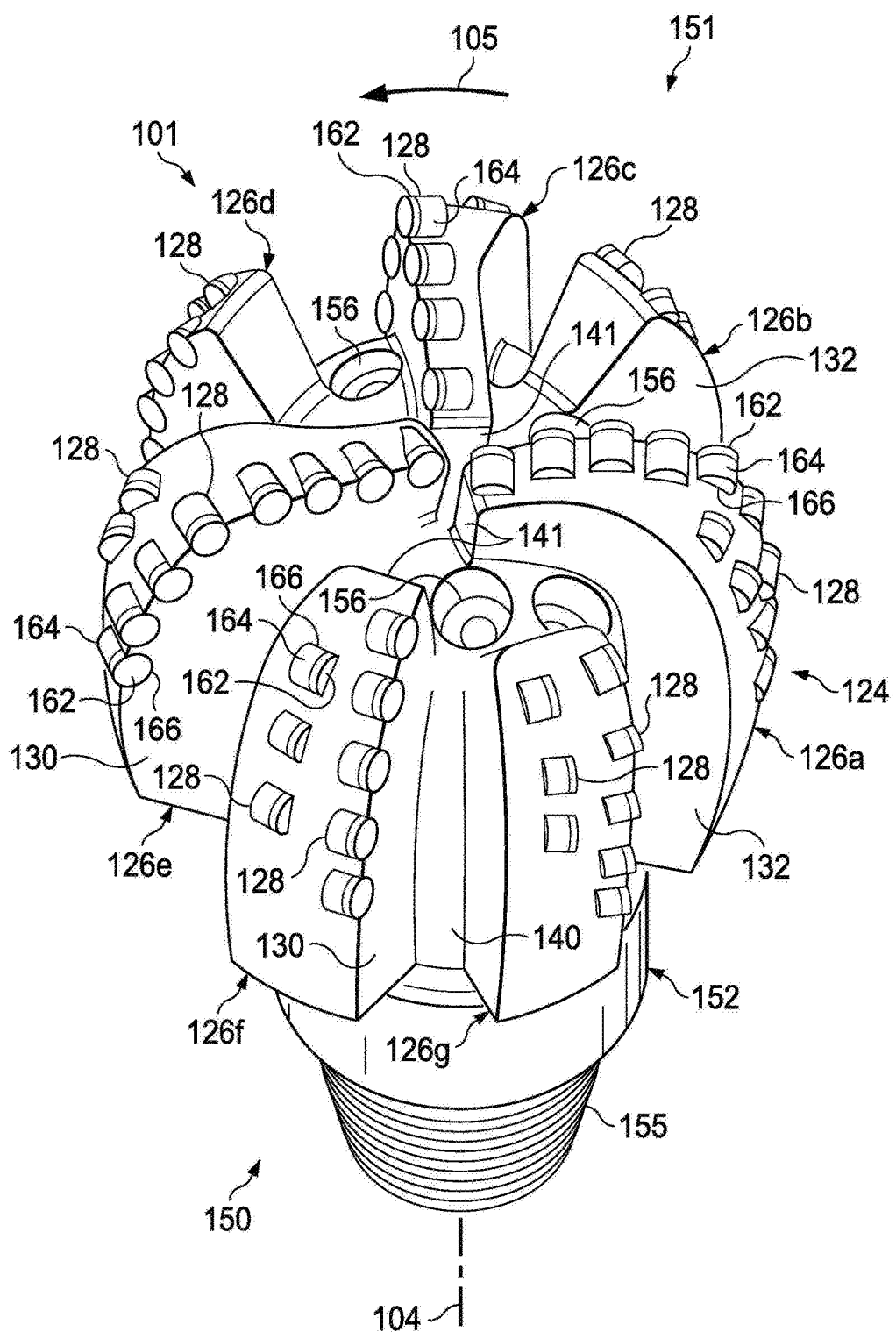
FIG. 2 is a perspective view of the drill bit of FIG. 1 illustrating a plurality of fixed cutters disposed on a bit body of the rotary drill bit.

FIG. 2 is a perspective view of the drill bit 101 of FIG. 1 illustrating a plurality of fixed cutting elements 128 disposed on the bit body 124. The drill bit 101 is illustrated in an upward orientation, often used to model, design and/or analyze fixed cutter drill bits. Drill bit 101 may be any of various types of rotary drill bits, including fixed cutter drill bits, polycrystalline diamond compact (PDC) drill bits, drag bits, matrix drill bits, and/or steel body drill bits operable to form a wellbore (e.g., wellbore 114 as illustrated in FIG. 1) extending through one or more downhole formations. Drill bit 101 may be designed and formed in accordance with teachings of the present disclosure and may have many different designs, configurations, and/or dimensions according to the particular application of the drill bit 101.

Drill bit 101 may include one or more blades 126 (e.g., blades 126a-126g) that define exterior portions of the bit body 124. Blades 126 may be any suitable type of projections extending radially outwardly from a rotational axis 104. Blades 126 may have a wide variety of configurations including, but not limited to, substantially arched, generally helical, spiraling, tapered, converging, diverging, symmetrical, and/or asymmetrical. In some embodiments, one or more blades 126 may have a substantially arched configuration extending from proximate rotational axis 104 of drill bit 101. The arched configuration may be defined in part by a generally concave, recessed shaped portion at a leading end 151 of the drill bit 101 extending from proximate bit rotational axis 104. The arched configuration may also be defined in part by a generally convex, outwardly curved portion disposed between the concave, recessed portion and exterior portions of each blade which correspond generally with the outside diameter of the rotary drill bit 101.

Blades 126a-126g may include primary blades 126a, 126c, and 126e having respective first ends 141 disposed closely adjacent to bit rotational axis 104 of drill bit 101. In some embodiments, blades 126a-126g may also include at least one secondary blade 126b, 126d, 126f, and 126g between the primary blades 126a, 126c, and 126e. The secondary blades 126b, 126d, 126f, and 126g have respective first ends 141 disposed at leading end 151 of drill bit 101 disposed at a relatively greater radial distance from bit rotational axis 104 than the first ends 141 of the primary blades 126a, 126c, and 126e. The number and location of primary blades and secondary blades may vary such that drill bit 101 includes more or fewer primary and secondary blades. Blades 126 may be disposed symmetrically or asymmetrically with regard to each other and bit rotational axis 104. In some embodiments, blades 126 and drill bit 101 may rotate about rotational axis 104 in a direction defined by arrow 105.

Each of the blades 126 may have respective leading surfaces 130 in the direction of rotation of the drill bit 101 and trailing surfaces 132 located opposite leading surfaces 130. In some embodiments, blades 126 may be positioned along bit body 124 such that they have a spiral configuration relative to bit rotational axis 104. In other embodiments, blades 126 may be positioned along bit body 124 in a generally parallel configuration with respect to each other and bit rotational axis 104.

Blades 126 may include one or more cutting elements 128 disposed thereon, which may include various types of cutters, compacts, buttons, inserts, and gage cutters satisfactory for use with a wide variety of drill bits 101. Although FIG. 2 illustrates two rows of cutting elements 128 on blades 126, other embodiments may include more or fewer rows. Cutting elements 128 may include respective substrates 164 with a layer of hard cutting material (e.g., cutting table 162) disposed on one end of each respective substrate 164. The hard layer of cutting elements 128 may provide a cutting surface that may engage adjacent portions of a downhole formation to form wellbore 114 (FIG. 1). The contact of the cutting surface with the formation may form a cutting zone associated with each of cutting elements 128, as described in further detail with respect to FIGS. 4A-4D. The edge of the cutting surface located within the cutting zone may be referred to as the cutting edge of a cutting element 128.

The substrates 164 of the cutting elements 128 may be constructed materials such as tungsten carbide. Tungsten carbides may include, but are not limited to, monotungsten carbide (WC), ditungsten carbide ($W_2C$), macrocrystalline tungsten carbide and cemented or sintered tungsten carbide. Substrates 164 may also be constructed of other hard materials, which may include various metal alloys and cements such as metal borides, metal carbides, metal oxides and metal nitrides. For some applications, the hard cutting layer may be formed from substantially the same materials as the substrate. In other applications, the hard cutting layer may be formed from different materials than the substrate. Examples of materials used to form hard cutting layers may include polycrystalline diamond materials, including synthetic polycrystalline diamonds. Blades 126 may include recesses or bit pockets 166 that may be configured to receive cutting elements 128. For example, bit pockets 166 may be concave cutouts on blades 126.

In some embodiments, blades 126 may also include one or more depth of cut controllers (DOCCs) (not expressly shown) configured to control the depth of cut of cutting elements 128. A DOCC may include an impact arrestor, a back-up or second layer cutting element and/or a Modified Diamond Reinforcement (MDR). Blades 126 may further include one or more gage pads (not expressly shown). A gage pad may include one or more layers of hardfacing material and may be constructed as on exterior portion of the blades 126. Gage pads may contact adjacent portions of a wellbore 114 (FIG. 1) formed by drill bit 101. Exterior portions of blades 126 and/or associated gage pads may be disposed at various angles (e.g., positive, negative, and/or parallel) relative to adjacent portions of the wellbore 114.

Trailing end 150 of drill bit 101 may include shank 152 with drill pipe threads 155 formed thereon. Threads 155 may releasably engage with corresponding threads (not shown) on BHA 120 (FIG. 1) such that the drill bit 101 may be rotated relative to bit rotational axis 104. Drilling fluids may be communicated from the BHA 120 to the drill bit 101, and the drilling fluids may be expelled through one or more nozzles 156.

Drill bit operation may be expressed in terms of depth of cut per revolution as a function of drilling depth. Depth of cut per revolution, or "depth of cut," may be determined by rate of penetration (ROP) and revolution per minute (RPM). ROP may represent the amount of formation that is removed as drill bit 101 rotates and may be expressed in units of ft/hr. Further, RPM may represent the rotational speed of drill bit 101. For example, drill bit 101 utilized to drill a formation may rotate at approximately 120 RPM. Actual depth of cut (Δ) may represent a measure of the depth that cutting elements cut into the formation during a rotation of drill bit 101. Thus, actual depth of cut may be expressed as a function of actual ROP and RPM using the following equation:

$$\Delta = ROP/(5 \times RPM)$$

Actual depth of cut may be expressed in units of in/rev.

The ROP of drill bit 101 is often a function of both weight on bit (WOB) and RPM. Drill string 103 (FIG. 1) may apply weight on drill bit 101 and may also rotate drill bit 101 about rotational axis 104 to form a wellbore 114 (e.g., wellbore 114a or wellbore 114b). For some applications a downhole motor (not expressly shown) may be provided as part of BHA 120 to also rotate drill bit 101. In some embodiments, the shape and the size of the rock chips generated by drill bit 101 in operation may depend on the location or configuration of cutting elements 128 or blades 126. Accordingly, a modeling system for predicting the size and shape of rock chips may take into consideration the location, orientation and configuration cutting elements 128, blades 126, or other components of drill bit 101 in order to model interactions of drill bit 101 with a geologic formation.

Figure 3A:
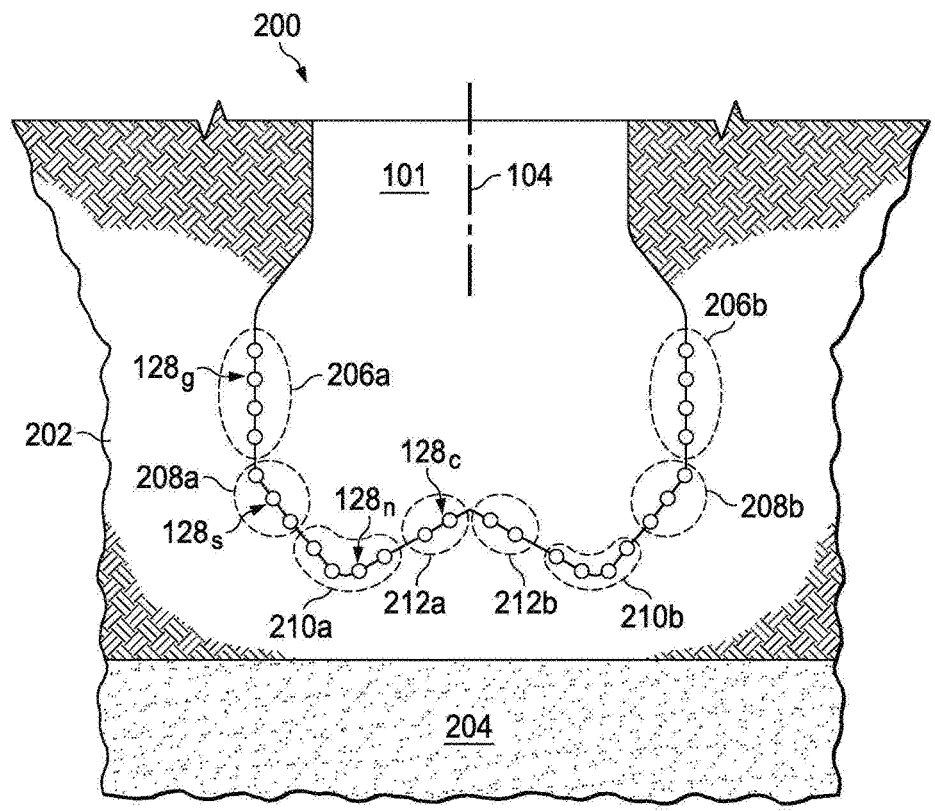
FIG. 3A is a cross-sectional view of the drill bit of FIG. 2, with portions removed, illustrating the drill bit drilling through a first portion of a geologic formation and into an adjacent second portion of the geologic formation.

FIG. 3A is a cross-sectional view of the drill bit 101 of FIG. 2, with portions removed, illustrating the drill bit 101 drilling through a first portion 204 of a geologic formation and into an adjacent second portion 204 of the geologic formation. Exterior portions of blades (not expressly shown) and cutting elements 128 may be projected rotationally onto a radial plane to form a bit face profile 200. In the illustrated embodiment, the first portion 202 of the geologic formation 202 may be described as "softer" or "less hard" when compared to second portion 204. As shown in FIG. 3A, exterior portions of drill bit 101 that contact adjacent portions of a downhole formation may be described as a "bit face." Bit face profile 200 may be substantially symmetric about bit rotational axis 104 due to the rotational projection of bit face profile 200, such that the zones or segments on one side of rotational axis 104 may be substantially similar to the zones or segments on the opposite side of rotational axis 104.

For example, bit face profile 200 may include a gage zone 206a located opposite a gage zone 206b, a shoulder zone 208a located opposite a shoulder zone 208b, a nose zone 210a located opposite a nose zone 210b, and a cone zone 212a located opposite a cone zone 212b. The cutting elements 128 included in each zone may be referred to as cutting elements of that zone. For example, cutting elements 128g included in gage zones 206 may be referred to as gage cutting elements, cutting elements 128s included in shoulder zones 208 may be referred to as shoulder cutting elements, cutting elements 128n included in nose zones 210 may be referred to as nose cutting elements, and cutting elements 128c included in cone zones 212 may be referred to as cone cutting elements.

Cone zones 212 may be generally convex and may be formed on exterior portions of each blade 126 (FIG. 2), adjacent to and extending radially out from bit rotational axis 104. Nose zones 210 may be generally convex and may be formed on exterior portions of each blade 126 adjacent to and extending from each cone zone 212. Shoulder zones 208 may be formed on exterior portions of each blade 126 extending from respective nose zones 210 and may terminate proximate to a respective gage zone 206. As shown in FIG. 3A, the area of bit face profile 200 may depend on cross-sectional areas associated with zones or segments of bit face profile 200 rather than on a total number of cutting elements, a total number of blades, or cutting areas per cutting element.

Figure 3B:
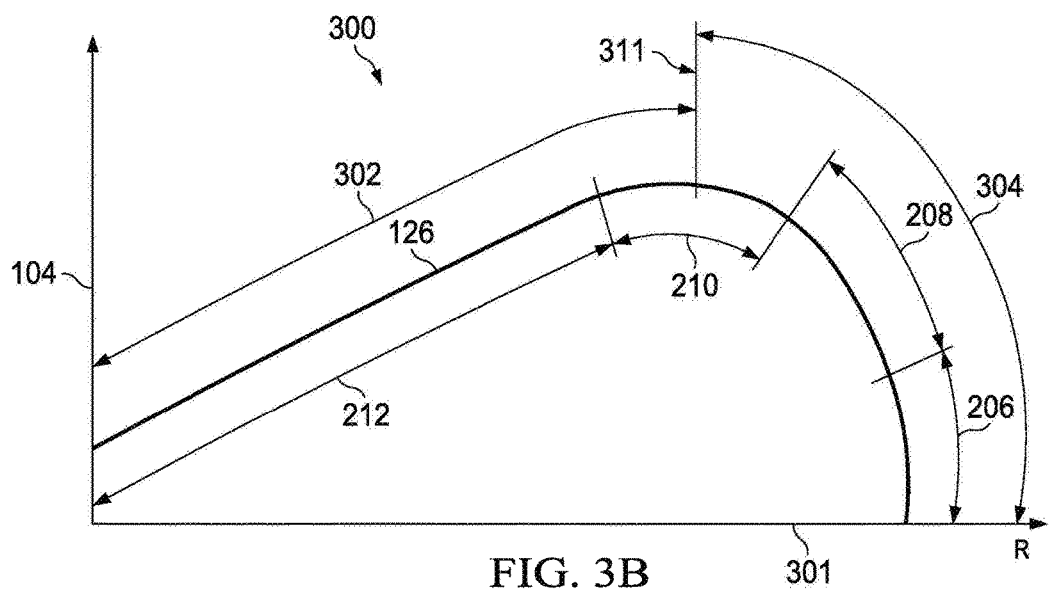
FIG. 3B is a schematic view of a blade profile of the drill bit of FIG. 2 that represents a cross-section of a blade of a drill bit.

FIG. 3B is a schematic view of a blade profile 300 of the drill bit 101 (FIG. 2) that represents a cross-section of a blade 126 of the drill bit 101. Blade profile 300 includes cone zone 212, nose zone 210, shoulder zone 208 and gage zone 206 as described above with respect to FIG. 3A. Cone zone 212, nose zone 210, shoulder zone 208 and gage zone 206 may be based on their location along blade 126 with respect to the rotational axis 104 and a horizontal reference line 301 that indicates a distance from rotational axis 104 in a plane perpendicular to rotational axis 104. A comparison of FIGS. 3A and 3B shows that blade profile 300 of FIG. 3B is upside down with respect to bit face profile 200 of FIG. 3A.

An inner zone 302 and an outer zone 304 may also be generally defined on blade profile 300. Inner zone 302 may extend radially outward from rotational axis 104 to a nose point 311. Outer zone 304 may extend from the nose point 311 to the end of blade 126. Nose point 311 may be the location on blade profile 300 within nose zone 210 that has maximum elevation as measured along a vertical axis, e.g., bit rotational axis 104, from a horizontal axis, e.g., reference line 301. A coordinate on the graph in FIG. 3B along the bit rotational axis 104 may be referred to as an axial coordinate or position. Similarly, a coordinate on the graph in FIG. 3B along reference line 301 may be referred to as a radial coordinate or radial position. The radial coordinate indicates a distance extending orthogonally from rotational axis 104 in a radial plane passing through rotational axis 104. For example, in FIG. 3B rotational axis 104 may be placed along a z-axis (see FIG. 4A) and reference line 301 may indicate the distance (R) extending orthogonally from rotational axis 104 to a point on a radial plane that may be defined as the ZR plane.

FIGS. 3A and 3B are for illustrative purposes only and modifications, additions or omissions may be made to FIGS. 3A and 3B without departing from the scope of the present disclosure. For example, the actual locations of the various zones with respect to the bit face profile may vary and may not be exactly as depicted.

FIGS. 4A-4D illustrate cutting edges 406 and cutting zones 404 of various cutting elements 402 disposed along a blade 400, which may considered by a modeling tool for predicting the size and shape of cuttings produced by an operational scenario. The location and size of cutting zones 404 (and consequently the location and size of cutting edges 406) may be selected, designed or determined based on factors including operational characteristics (e.g., the ROP and RPM of the bit), and geometric characteristics of the bit face profile, e.g., the size of cutting elements 402, and the location and orientation of cutting elements 402 along the blade profile of blade 400.

Figure 4A:
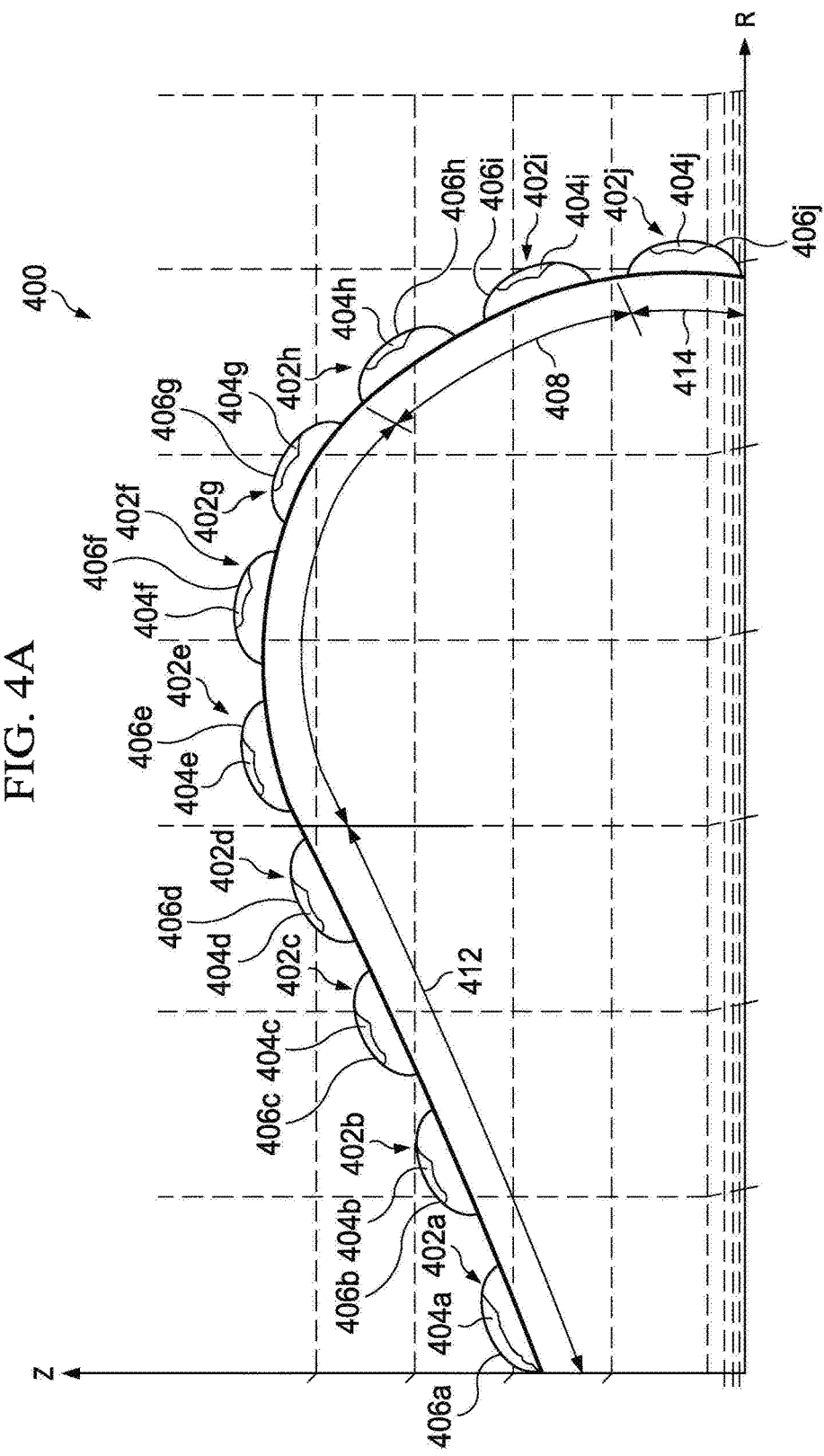

FIG. 4A illustrates a graph of a profile of blade 400 indicating radial and axial locations of cutting elements 402a-402j along blade 400. The vertical axis ("Z") depicts the axial position of blade 400 along a bit rotational axis and the horizontal axis ("R") depicts the radial position of blade 400 from the bit rotational axis in a radial plane passing through the bit rotational axis. Blade 400 may be substantially similar to one of blades 126 described with respect to FIGS. 1-3 and cutting elements 402 may be substantially similar to cutting elements 128 described with respect to FIGS. 1-3. In the illustrated embodiment, cutting elements 402a-402d may be located within a cone zone 412, cutting elements 402e-402g may be located within a nose zone 410, cutting elements 402h-402i may be located within a shoulder zone 408, and cutting element 402j may be located within a gage zone 414 of blade 400. Cone zone 412, nose zone 410, shoulder zone 408 and gage zone 414 may be substantially similar to cone zone 212, nose zone 210, shoulder zone 208 and gage zone 206, respectively, described with respect to FIGS. 3A and 3B.

FIG. 4A illustrates cutting zones 404a-404j, with each cutting zone 404 corresponding with a respective cutting element 402. As mentioned above, each cutting element 402 may have a cutting edge 406 located within a cutting zone 404. From FIG. 4A it can be seen that the size, shape and location of each cutting zone 404 may be different based on the axial and radial locations of the cutting element 402 on blade 400, which may be related to the various zones of blade 400.

FIG. 4B illustrates an exploded graph of cutting element 402b from the cone zone 412 (FIG. 4A) to further detail cutting zone 404b and cutting edge 406b. The size, location and shape cutting zone 404b may be calculated, determined and/or estimated based at least partially on cutting element 402b being located in cone zone 412 and having axial and radial positions corresponding with cone zone 412. As mentioned above, cutting edge 406b may be the edge of the cutting surface of cutting element 402b that is located within cutting zone 404b. FIG. 4C illustrates an exploded graph of cutting element 402f from nose zone 4101 (FIG. 4A) to further detail cutting zone 404f and cutting edge 406f associated with cutting element 402f. Cutting zone 404f may be based at least partially on cutting element 402f being located in nose zone 410 and having axial and radial positions corresponding with nose zone 410. FIG. 4D illustrates an exploded graph of cutting element 402h from shoulder zone 408 (FIG. 4A) to further detail cutting zone 404h and cutting edge 406h associated with cutting element 402h. Cutting zone 404h may be based partially on cutting element 402h being located in shoulder zone 408 and having axial and radial positions corresponding with shoulder zone 408.

An analysis of FIG. 4A and a comparison of FIGS. 4B-4D reveal that the locations of cutting zones 404 of cutting elements 402 may vary at least in part on the axial and radial positions of cutting elements 402 with respect to rotational axis 104. Accordingly, a modeling tool for predicting the size and shape of cuttings may take into consideration the location, orientation and configuration cutting elements 402 of a drill bit in order to incorporate interactions of downhole drilling tools with formations.

Figure 5A:
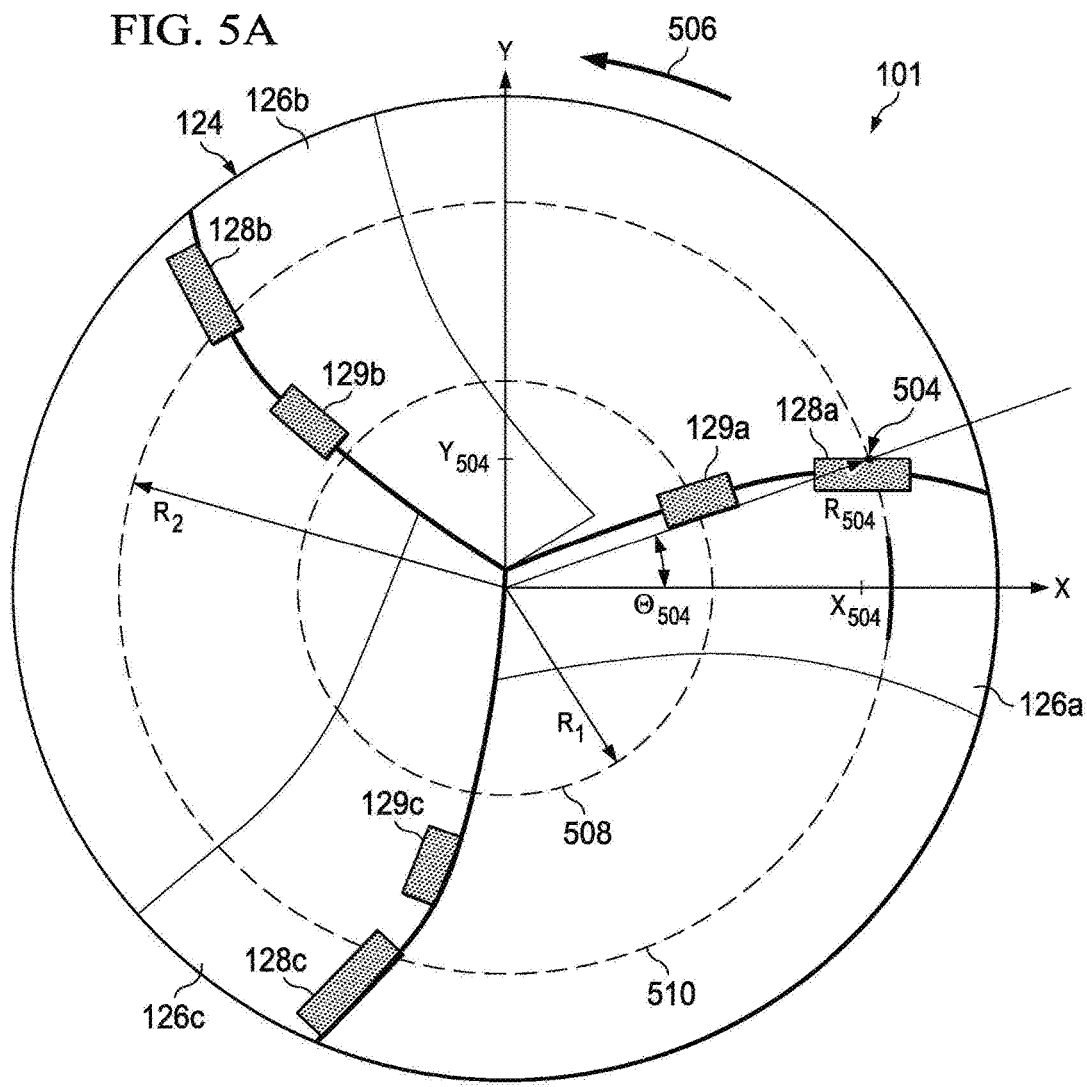
FIG. 5A is a schematic top view of the drill bit of FIG. 2 illustrating a bit face that may be analyzed to predict the size and shape of rock chips that would be produced by the drill bit in operation.
Figure 5B:
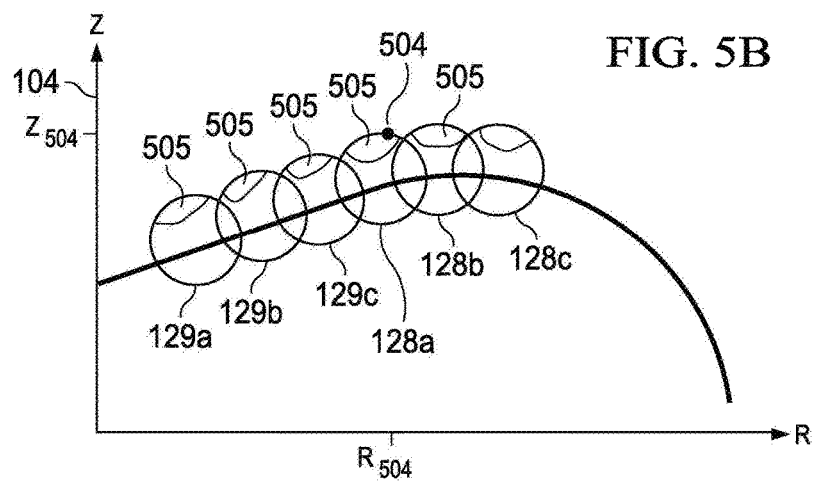
FIG. 5B is a graphical view of a bit profile of the drill bit of FIG. 2 illustrating the locations of cutting elements along the bit profile and an estimated size, shape and location of cutting zones 505 defined on the cutting elements in accordance with some embodiments of the present disclosure.

FIG. 5A is a schematic top view of the drill bit 101 illustrating a bit face that may be analyzed to predict the size and shape of rock chips that would be produced by the drill bit 101 in operation. FIG. 5B illustrates the locations of cutting elements 128, 129 of the drill bit of FIG. 5A along the bit profile of the drill bit 101 and an estimated size, shape and location of cutting zones 505 defined on the cutting elements 128, 129 in accordance with some embodiments of the present disclosure.

To provide a frame of reference, FIG. 5A includes an x-axis and a y-axis and FIG. 5B includes a z-axis that may be associated with rotational axis 104 of drill bit 101 and a radial axis (R) that indicates the orthogonal distance from the center of the bit 101 in the x-y plane. Accordingly, a coordinate or position corresponding to the z-axis may be referred to as an axial coordinate or axial position of the bit face profile. Additionally, a location along the bit face may be described by x and y coordinates of an x-y plane substantially perpendicular to the z-axis. The distance from the center of bit 101 (e.g., rotational axis 104) to a point in the x-y plane of the bit face may indicate the radial coordinate or radial position of the point on the bit face profile of bit 101. For example, the radial coordinate, r, of a point in the x-y plane having an x coordinate, x, and a y coordinate, y, may be expressed by the following equation:

$$r = \sqrt{x^2 + y^2}$$

Additionally, a point in the x-y plane may have an angular coordinate that may be an angle between a line extending from the center of bit 101 (e.g., rotational axis 104) to the point and the x-axis. For example, the angular coordinate (θ) of a point in the x-y plane having an x-coordinate, x, and a y-coordinate, y, may be expressed by the following equation:

$$\theta = \arctan\left(\frac{y}{x}\right)$$

As a further example, a point 504 located on the cutting edge of cutting element 128a (as depicted in FIGS. 5A and 5B) may have an x-coordinate ($X_{504}$) and a y-coordinate ($Y_{504}$) in the x-y plane that may be used to calculate a radial coordinate ($R_{504}$) of point 504 (e.g., $R_{504}$ may be equal to the square root of $X_{504}$ squared plus $Y_{504}$ squared). $R_{504}$ may accordingly indicate an orthogonal distance of point 504 from rotational axis 104. Additionally, point 504 may have an angular coordinate ($\theta_{854}$) that may be the angle between the x-axis and the line extending from rotational axis 104 to point 504 (e.g., $\theta_{504}$ may be equal to $\arctan(X_{504}/Y_{504})$). Further, as depicted in FIG. 5B, point 504 may have an axial coordinate ($Z_{504}$) that may represent a position along the z-axis that may correspond to point 504. It is understood that the coordinates are used for illustrative purposes only, and that any other suitable coordinate system or configuration, may be used to provide a frame of reference of points along the bit face and bit face profile of drill bit 101. Additionally, any suitable units may be used. For example, the angular position may be expressed in degrees or in radians.

As described above, drill bit 101 may include a bit body 124 with a plurality of blades 126 positioned along bit body 124. As illustrated in FIG. 5A, drill bit 101 may include blades 126a-126c, however it is understood that in other embodiments, drill bit 101 may include more or fewer blades 126, and more or fewer of the blades 126 on the drill bit 101 may be considered in an analysis in which the shape and size of rock chips are predicted. Blades 126 may include outer cutting elements 128 and inner cutting elements 129 disposed along blades 126. For example, blade 126a may include outer cutting element 128a and inner cutting element 129a, blade 126b may include outer cutting element 128b and inner cutting element 129b and blade 126c may include outer cutting element 128c and inner cutting element 129c.

As drill bit 101 rotates, cutting elements 128 and 129 may follow a rotational path indicated by radial paths 508 and 510. Radial paths 508 and 510 may be defined by radial coordinates $R_1$ and $R_2$. $R_1$ may indicate the orthogonal distance from rotational axis 104 to the centers of cutting elements 129 (with respect to the center of drill bit 101). $R_2$ may indicate the orthogonal distance from rotational axis 104 to the centers of cutting elements 128 (with respect to the center of drill bit 101).

Modifications, additions or omissions may be made to FIGS. 5A and 5B without departing from the scope of the present disclosure. For example, the number of blades 126 and cutting elements 128 may vary according to the various design constraints and considerations of drill bit 101.

Figure 6A:
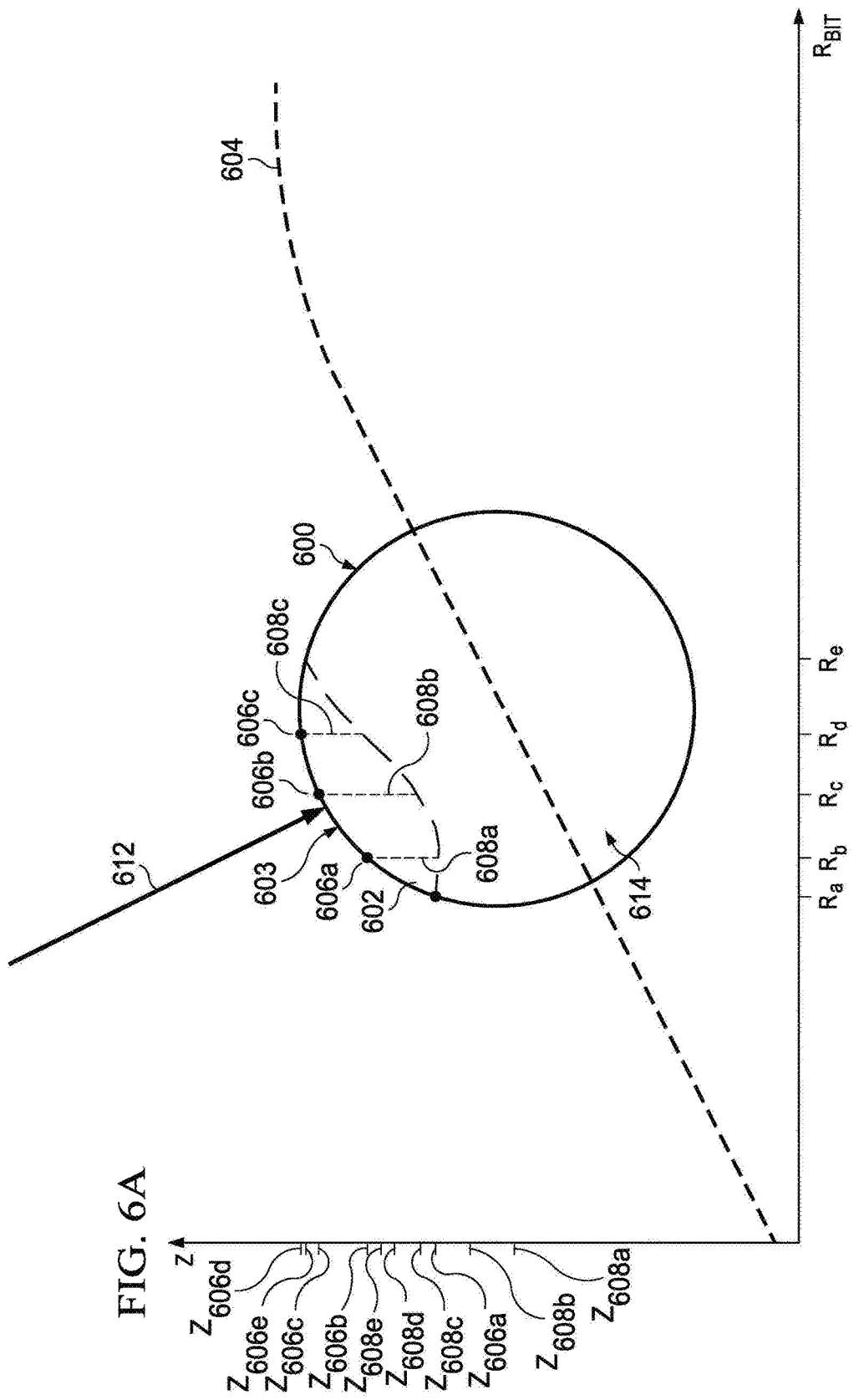
FIG. 6A is a graphical view of a cutting element divided into cutlets along a bit face profile.

FIG. 6A illustrates a graph of a bit face profile 604 of a cutting element 600 in accordance with some embodiments of the present disclosure. The coordinate system used in FIG. 6A may be substantially similar to that described with respect to FIGS. 5A and 5B. Therefore, the rotational axis of the drill bit corresponding with FIG. 6A may be associated with the z-axis of a Cartesian coordinate system to define an axial position with respect to a drill bit. Additionally, an x-y plane of the coordinate system may correspond with a plane of a bit face of the drill bit that is substantially perpendicular to the rotational axis. Coordinates on the x-y plane may be used to define radial and angular coordinates associated with the drill bit on which the cutting element 600 of FIG. 6A is disposed.

FIG. 6A illustrates the axial and radial coordinates of cutting element 600 and cutting zone 602 (and its associated cutting edge 603) of cutting element 600. Cutting edge 603 of cutting element 600 that corresponds with cutting zone 602 may be divided according to cutlets 606a-606c that have radial and axial positions as depicted in FIG. 6A. Each cutlet may have an associated depth of cut 608a-608c.

In accordance with some embodiments, downhole drilling modeling tools may be used to model the operation of drill bits operating under certain operational conditions including engaging with geologic formations with certain rock properties. Downhole drilling modeling tools may calculate at least two forces acting on each cutting element: drag force 612 ($F_d$) and penetration force 610 ($F_p$) as indicated in FIG. 6B. FIG. 6B illustrates a cross sectional view of the exemplary cutting element 600, including associated drilling forces 610, 612. As shown in FIGS. 6A and 6B, penetration force 610 may act in the direction of bit axis. As shown in FIG. 6B, drag force 612 may act perpendicularly to penetration force 610, in the direction of cutting face 614. Drag force 612 and penetration force 610 may depend on cutting element geometry coefficients ($K_d$) and ($K_p$), which may be functions of a back rake angle, side rake angle and profile angle of cutting element 600. Further, drag force 612 and penetration force 610 may additionally depend on rock compressive strength ($\sigma$) and area ($\Delta$) of cutting zone 602.

However, in some embodiments, more complex force models may be employed if, for example, cutting areas of cutting elements, cutting element geometry coefficients, or rock compressive strength at the location of a cutting element vary between cutting elements. For example, a downhole drilling modeling tool may, receive as inputs (typically as an ASCII file) a description of cutting elements locations, cutlet locations, rake angles, formation compressive strength, rate of penetration (ROP), weight on bit (WOB), and/or rotations per minute (RPM). Modifications, additions or omissions may be made to FIG. 6 without departing from the scope of the present disclosure. Although a specific number of cutlets and depths of cut are described, it is understood that any appropriate number may be used to configure analyze an efficiency of a cutting element or a drill bit.

FIG. 7 illustrates a cross sectional view of an exemplary cutting element 704 engaged with geologic formation 702. As a drill bit, such as drill bit 101 discussed above with reference to FIG. 1, rotates around a rotational axis, cutting elements, such as cutting element 704, may contact a formation, such as formation 702. Rotation of drill bit 101 may apply forces to cutting element 704 that cause the cutting element to move across formation 702 laterally in direction 710. Direction 710 may lie in a plane substantially perpendicular to the bit rotational axis. As cutting element 704 engages with formation 702 by moving in direction 710, material in area 712 may be removed by cutting face 706 of cutting element 704.

Further, engagement of cutting element 704 with formation 702 may also remove material in front of cutting face 706. For example, the interaction of cutting element 704 with formation 702 may cause a cutting or rock chip 708 to separate from the formation 702. Rock chip 708 may be demarcated by crack trajectory 718. Crack trajectory 718 may begin at a point, corresponding to cutlet 724, along a cutting edge of cutting face 706. Crack trajectory 718 may follow a generally parabolic path to surface 726 of formation 702, reaching surface 726 at chip end 728. The shape of crack trajectory 718 may be based on a variety of factors. For example, the shape of crack trajectory 718 may depend on depth of cut of cutting element 704, the initial angle of crack trajectory 718 from cutting face 706, confining pressure, mud pressure, rock shear strength, whether formation 702 is in a brittle or ductile mode, or any other suitable drilling parameter or property of formation 702.

As depicted in FIG. 7, cutlet 724 may have depth of cut 714 ($\Delta_{714}$) in cutting face 706. Each cutlet associated with a cutting zone of a cutting element, such as cutlets 606a-606c (as discussed above with reference to FIG. 6), may have a different depth of cut. Thus, each cutlet associated with a cutting element may have a different associated crack trajectory, and consequently may be associated with a different size of rock chip.

Because a particular drill bit may have a large number of cutting elements, each with a number of associated cutlets, it may be computationally intensive to model a parabolic crack trajectory for each rock chip. Accordingly, in some embodiments, crack trajectories may be modeled as straight lines. FIG. 8 illustrates a modeled approximation of rock chip 808 in accordance with some embodiments of the present disclosure. Although a crack trajectory may have a generally parabolic shape, a rock chip may be modeled as having a triangular shape, such as, for example, modeled rock chip 808. For example, modeled rock chip 808 may have an associated modeled rock chip boundary 818. Modeled rock chip boundary 818 may be a straight line between cutlet 824 and rock chip end 828. By modeling a rock chip in this manner, instances of modeled rock chip 808 may be characterized by modeled depth of cut 814 and modeled rock chip angle 820. Modeled depth of cut 814 may be the distance along a line perpendicular to surface 826 between cutlet 824 and a line extending along surface 826 of formation 802. Modeled rock chip angle 820 may be the angle formed between modeled crack trajectory 818 and surface 826.

Under a given set of drilling parameters including the type of rock being drilled through, rock chips may have similar rock chip angles. Thus, for a given set of drilling parameters, such as confining pressure, mud pressure, rock shear strength, depth of cut of a cutting element or any other suitable drilling parameter, each rock chip may be assumed to have the same modeled rock chip angle. Modeled rock chip angle 820 ($\psi$) may be empirically determined from lab tests or field tests by operating a drill bit under a variety of drilling parameters and collecting and measuring rock chips. For example, chip length 822 (L) and chip height 810 ($\delta c$) may be measured. In some embodiments, chip height 810 may be calculated based upon depth of cut 814 ($\delta$) of an associated cutlet, back rake angle 816 ($\beta$), and modeled rock chip angle 820 ($\psi$). Accordingly, modeled rock chip angle 820 ($\psi$) may be expressed by the following equation:

$$\psi = \arctan\left(\frac{\delta c}{L}\right)$$

However, rock chips may only be created when depth of cut 814 is greater than a critical depth of cut. Critical depth of cut may depend on confining pressure, mud pressure, rock shear strength, or any other suitable drilling parameter or formation property. Critical depth of cut may numerically be modeled or observed in laboratory or field testing. In some embodiments, a critical depth of cut may be determined by analysis of a distribution of measured chip heights. A critical depth of cut may be estimated, for example, by determining the smallest chip height, a first quartile of chip heights, a chip height corresponding to three standard deviations below the mean chip height, or any other suitable method of analyzing a distribution of measured chip heights.

Once the properties of two-dimensional rock chips, such as modeled rock chip 808 (discussed above with reference to FIG. 8), have been determined, three-dimensional rock chips may be modeled. As cutting elements engage with formations, three-dimensional rock chips of varying sizes may separate from formations in advance of the cutting edges of the cutting elements. Variations in sizes of rock chips may correlate with variations in the depth of cut associated with different cutlets of the cutting elements. For example, each cutlet associated with a cutting element may have a different depth of cut. Accordingly, as described with reference to FIGS. 7 and 8, cutlets may be associated with two-dimensional rock chips of varying sizes. In accordance with some embodiments of the present disclosure, three-dimensional rock chips may be modeled as aggregations of these two-dimensional rock chips associated with cutlets of a cutting element. Thus, in some embodiments, three-dimensional rock chips may consist of groups of adjacent two-dimensional rock chips associated with cutlets of a cutting element.

Figure 9B:
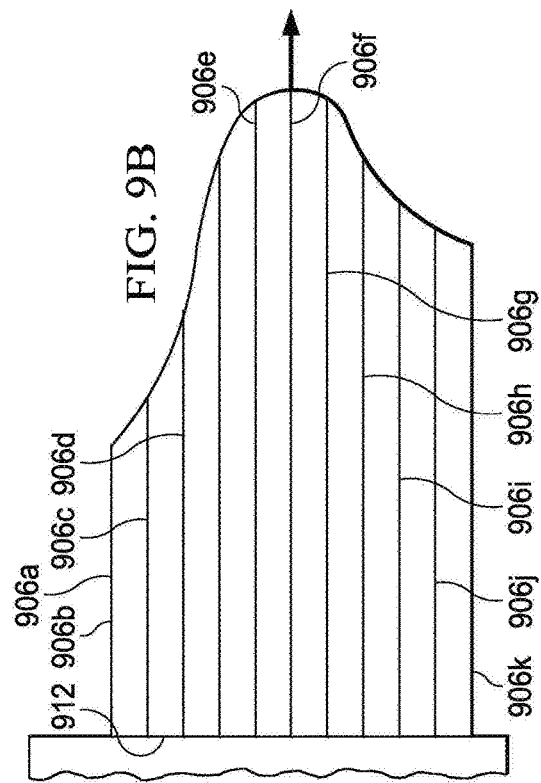
FIGS. 9A and 9B are diagrammatic views of a three-dimensional rock chip divided into an example group of cutlets.
Figure 9A:
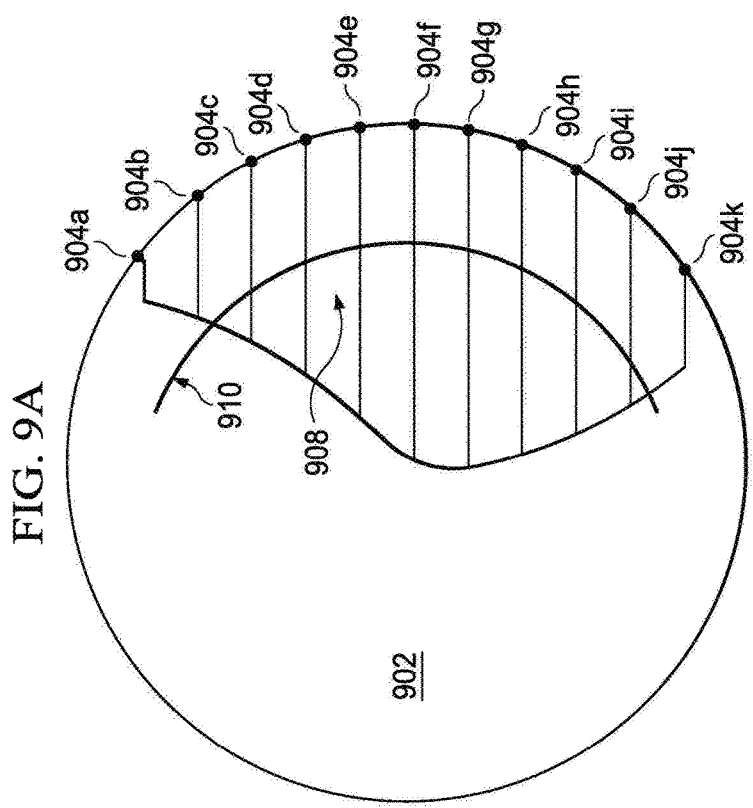

FIGS. 9A and 9B illustrate an exemplary modeled three-dimensional rock chip in accordance with some embodiments of the present disclosure. FIG. 9A illustrates a three-dimensional rock chip divided into an exemplary group of cutlets, in accordance with some embodiments of the present disclosure. In some embodiments, two or more cutlets associated with a cutting area of a cutting element may generate rock chips of varying sizes according to a depth of cut. For example, cutting element 902, as shown in FIG. 9A, may include cutting zone 908. Cutting zone 908 may include any number of cutlets 904a-904k. Each cutlet 904a-904k may include an associated depth of cut ($\delta$). Under a particular set of drilling parameters, critical depth of cut 910 may be determined. Accordingly, if any depth of cut of cutlets 904a-904k is greater than critical depth of cut 910, two-dimensional rock chips may be formed when cutting element 902 contacts a formation during a drilling operation. In some embodiments, rock chips associated with cutlets 904a-904k may be modeled as two-dimensional rock chips as previously discussed in conjunction with FIGS. 7 and 8. For example, for a particular cutting element, if the maximum modeled depth of cut associated with cutlets 904a-904k is less than critical depth of cut 910, no two-dimensional rock chips associated with cutting element 902 may be modeled. Alternatively, if the maximum modeled depth of cut associated with a particular cutting element 902 is greater than critical cutting depth 910, a rock chip associated with each particular cutlets 904a-904k may be modeled.

FIG. 9B illustrates exemplary two-dimensional rock chip lengths for an associated three-dimensional rock chip in accordance with some embodiments of the present disclosure. As shown in FIG. 9A, exemplary cutlets 904a, 904b and 904k include an associated depth of cut less than critical depth of cut 910. Accordingly, cutlets 904a, 904b and 904k do not have associated modeled rock chip lengths. As further shown in FIG. 9A, cutlets 904c-904j include an associated depth of cut greater than critical depth of cut 910. Accordingly, rock chips associated with cutlets 904c-904j include associated modeled rock chip lengths 906c-906j. Modeled rock chip lengths 906c-906j may extend substantially perpendicularly from cutting face 912 of cutting element 902. Alternatively, if the modeled depth of cut associated with a particular cutlet 904 is greater than critical depth of cut 910, modeled rock chip lengths 906c-906j ($L_x$) may be calculated for a particular set of drilling parameters as a function of chip height ($\theta_x$) and rock chip angle ($\psi$), as expressed by the following equation:

$$L_x = \frac{\delta_x}{\tan(\psi)}$$

After rock chips associated with cutlets 904c-904j are modeled as extending from cutting face 912, three-dimensional areas encompassing groups of adjacent two-dimensional rock chips may be referred to as three-dimensional rock chips. A combination of a set of two-dimensional rock chips associated with cutlets of a single cutting element may be referred to as a three-dimensional rock chip.

In some embodiments, three-dimensional rock chips associated with cutting elements of a drill bit may be generated by a modeling system and incorporated into a simulated downhole drilling operation. A model of an initial borehole extending into a geologic formation may be generated by modeling a full revolution of a drill bit without axial penetration into the formation. Subsequently, in some embodiments, a borehole bottom of the initial borehole may be divided into a grid using a polar coordinate system. The grid may be formed using constant steps ($d_r$) in the radial direction, and constant steps ($d_\theta$) in the circumferential direction. Each grid point may include an associated formation height measured along a z-axis that may be associated with rotational axis of a drill bit, such as the z-axis shown in FIG. 5. The interactions of a drill bit with a formation may be analyzed by modeling incremental rotations of the drill bit around a rotational axis in discrete time steps. The rotational axis may be the bit rotational axis 104 (FIG. 1), or any other suitable axis. At each incremental time step, locations of each cutting elements and associated cutlets may be updated. If an updated location of a cutlet indicates that the cutlet cuts into the borehole bottom during a time step, the associated formation height may be updated according to the depth of the cut of the cutlet.

Figure 10:
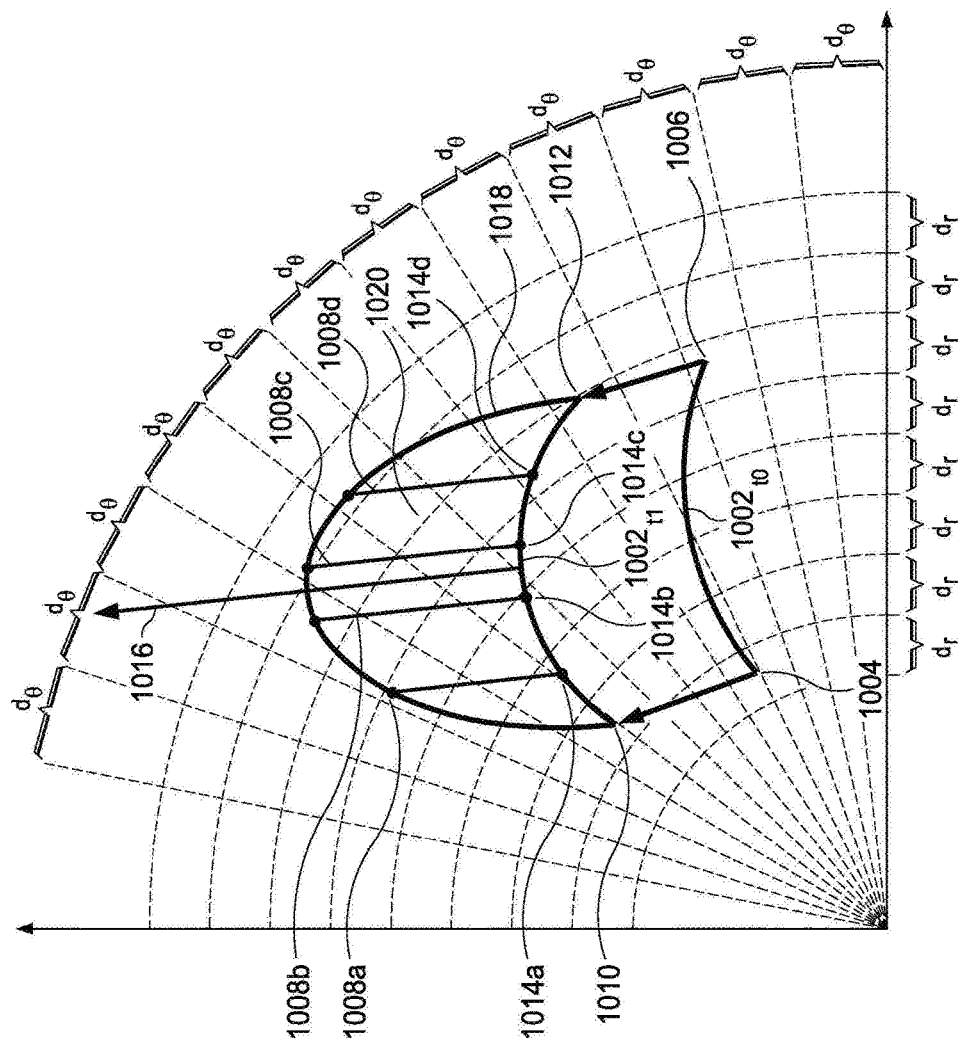
FIG. 10 is a diagrammatic view of a rock chip created by a single cutting element illustrating a rock chip boundary.

FIG. 10 illustrates an exemplary boundary of a rock chip created by a single cutting element. At time $t_0$, a modeling system simulating a downhole drilling operation may indicate that an exemplary cutting element $1002_{t0}$ is located along an arc between endpoints 1004 and 1006. At time $t_1$, the modeling system may further indicate that the cutting element $1002_{t1}$ is located along an arc between endpoints 1010 and 1012. At time $t_i$, cutting element $1002_{ti}$ may be divided into associated cutlets 1014a-1014d. Some modeling systems may update formation heights only in areas bounded by the positions of cutting element 1002 at times $t_0$ and $t_1$. For example, these modeling systems may only analyze drill bit interactions with formations in the area bounded by endpoints 1004, 1006, 1010, and 1012. Other modeling systems may further analyze drill bit interactions with formations in advance of the cutting elements by, for example, modeling the creation of three-dimensional rock chips and removing the three-dimensional rock chips from exposed surfaces of a modeled geologic formation within a borehole model.

For example, in some embodiments, after the modeling system indicates locations of cutting element 1002 and associated cutlets 1014a-1014d, the modeling system may simulate or model a removal of three-dimensional rock chip 1020. In accordance with the discussions associated with FIGS. 7, 8, 9A, and 9B, a shape of three-dimensional rock chip 1020 may be modeled by analyzing two-dimensional rock chips associated with cutlets 1014a-1014d.

In some embodiments, for each cutlet 1014a-1014d, the modeling system may indicate an associated depth of cut. Further, based on modeled drilling parameters, a critical depth of cut may be determined. Accordingly, for each cutlet 1014a-1014d, if an associated depth of cut is greater than the critical depth of cut, a two-dimensional rock chip may be modeled. Rock chip lengths 1008a-1008d may be determined based on modeled drilling parameters such as a modeled rock chip angle. Rock chip lengths 1008a-1008d may be calculated according to the techniques discussed in conjunction with, for example, FIGS. 9A and 9B.

In some embodiments, a modeling system may indicate cutting direction 1016 at time $t_1$. Accordingly, rock chips may be modeled as originating at coordinates associated with cutlets 1014a-1014d and running substantially parallel to cutting direction 1016 along rock chip lengths 1008a-1008d. In some embodiments, coordinates of cutlets 1014a-1014d fall between grid points, and a modeling system may analyze features of a rock chip based on interstitial cutter coordinates. In the same or other embodiments, coordinates of cutlets 1014a-1014d may be interpolated to correspond to grid points. Chip boundary 1018 may be selected along a path between endpoints 1010 and 1012 that encompasses the ends of rock chip lengths 1008a-1008d. Each grid point within the area circumscribed by chip boundary 1018 and cutting element 1002$_{t1}$ may be assigned a new borehole bottom depth based upon locations and geometries of modeled rock chips. For example, modeled heights of the borehole bottom assigned to grid points associated with cutlets 1014a-1014d may be reduced by the depth of cut of the associated cutlets. Further, modeled heights of the borehole bottom assigned to grid points located along chip boundary 1018 may remain unaltered. Additionally, modeled heights of the borehole bottom assigned to grid points along rock chip lengths 1008a-1008d may be reduced by modeling a crack trajectory as a straight line between cutlets 1014a-1014d and chip boundary 1018 and linearly interpolating rock chip heights along rock chip lengths 1008a-1008d. In order to expand the single cutting element model, discussed in conjunction with FIG. 10, into a full bit model, a modeling system may repeat the analysis associated with FIG. 10 for each cutting element on a drill bit at each time step.

FIG. 10 is for illustrative purposes only and modifications, additions or omissions may be made to FIG. 10 without departing from the scope of the present disclosure. For example, although FIG. 10 is discussed using a polar coordinate system, it will be understood that any suitable coordinate system may be used, such as a Cartesian coordinate system or a spherical coordinate system.

Figure 11:
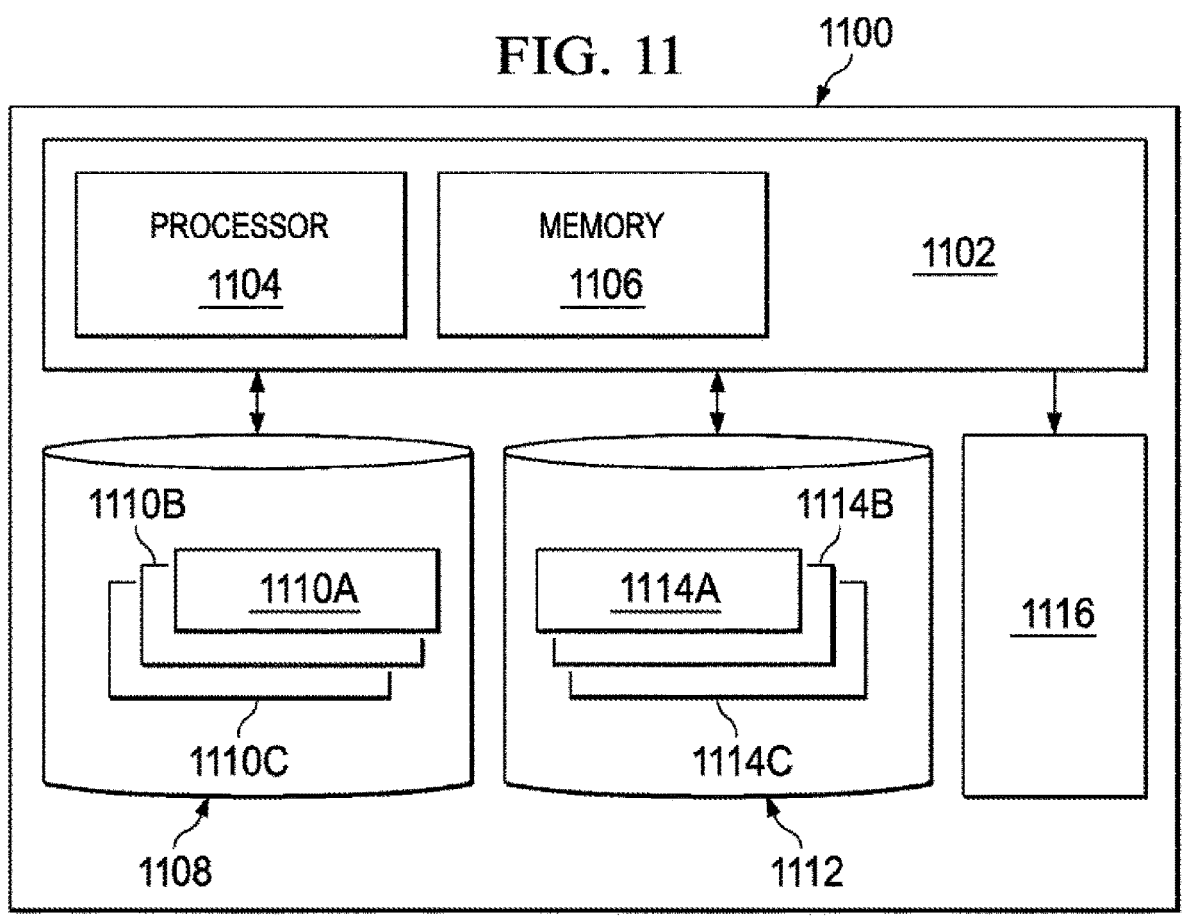
FIG. 11 is a block diagram of an example downhole drilling modeling system useful in modeling rock chips in accordance with embodiments of the present disclosure.

FIG. 11 illustrates a block diagram of an exemplary modeling system 1100, in accordance with some embodiments of the present disclosure. Modeling system 1100 may be configured to perform three-dimensional modeling of the interactions between drill bits and geologic formations, which may include. e.g., simulating the creation of rock chips having various shapes and sizes. The modeling system 1100 may also be operable to categorize the rock chips and to determine a distribution of the rock chips produced in a simulated interaction between a drill bit and a geologic formation. In some embodiments, modeling system 1100 may include modeling system module 1102. Modeling system module 1102 may include any suitable components, including. e.g., processor 1104 and memory 1106. Processor 1104 may include, for example a microprocessor, microcontroller, digital signal processor (DSP), application specific integrated circuit (ASIC), or any other digital or analog circuitry configured to interpret and/or execute program instructions and/or process data. In some embodiments, processor 1104 may be communicatively coupled to the memory 1106, and may be configured to interpret and/or execute program instructions and/or data stored in the memory 1106. Program instructions or data may constitute portions of software for carrying out three-dimensional modeling of interactions between drill bits, geologic formations and rock chips, as described herein. Memory 1106 may include any system, device, or apparatus configured to hold and/or house one or more memory modules. For example, memory 1106 may include read-only memory, random access memory, solid state memory, or disk-based memory. Each memory module may include any system, device or apparatus configured to retain program instructions and/or data for a period of time (e.g., computer-readable non-transitory media).

Modeling system 1100 may further include bit design database 1108. Bit design database 1108 may be communicatively coupled to modeling system module 1102 and may provide drill bit designs 1110a-1110c in response to a query or call by modeling system module 1102. Drill bit designs 1110a-1110c may be implemented in any suitable manner, such as by parameters, functions, definitions, instructions, logic, or code, and may be stored in, e.g., a database, file, application programming interface, library, shared library, record, data structure, service, software-as-service, or any other suitable mechanism. Drill bit designs 1110a-1110c may specify any suitable configuration of components of a drill bit, such as, for example, components of drill bit 101 (FIG. 1). Although bit design database 1108 is illustrated as including three drill bit designs, bit design database 1108 may contain any suitable number of drill bit designs.

Modeling system 1100 may further include rock property database 1112. Rock property database 1112 may be communicatively coupled to modeling system module 1102 and may provide rock property parameters 1114a-1114c in response to a query or call by modeling system module 1102. Rock property parameters 1114a-1114c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Rock property parameters 1114a-1114c may specify any suitable properties or parameters of geophysical formations, such as rock shear strength, rock failure mode, porosity, rock strength, or density. Rock property parameters 1114a-1114c may further include parameters specifying rock chip angles, such as rock chip angle 820 ($y$) discussed above with reference to FIG. 8, associated with any suitable combinations of drilling parameters or formation properties. Although rock property database 1112 is illustrated as including three instances of rock property parameters, rock property database 1112 may contain any suitable number of instances of rock property parameters.

In some embodiments, modeling system module 1102 may be configured to perform three-dimensional modeling of interactions between drill bits, geologic formations and rock chips. For example, modeling system module 1102 may be configured to import one or more instances of drill bit designs 1110a-1110c, and/or one or more instances of rock property parameters 1114a-1114c. Drill bit designs 1110a-1110c, and/or rock property parameters 1114a-1114c may be stored in memory 1106. Modeling system module 1102 may be further configured to cause processor 1104 to execute program instructions operable to perform three-dimensional modeling of interactions between drill bits and rock chips. For example, processor 1104 may, based on drill bit designs 1110a-1110c, generate a model of an initial borehole bottom by modeling a full revolution of a drill bit represented in drill bit designs 1110a-1110c without axial penetration.

Modeling system module 1102 may be further configured to cause processor 1106 to determine a position of one or more cutting elements on one or more blades of a drill bit, such as cutting elements 128 (FIG. 1). Modeling system module 1102 may also be configured to identify locations for one or more cutlets associated with cutting elements. For example, modeling system module 1102 may identify a location in polar coordinates by identifying a radial coordinate and an angular coordinate, such as radial coordinate $R_{504}$ or angular coordinate $\theta_{504}$ (FIG. 5). Modeling system module 1102 may be further configured to calculate a depth of cut, e.g., depth of cut 814 (FIG. 8), for each cutlet based on the location of the cutlet and a three-dimensional model of a borehole bottom. Additionally, modeling system module 1102 may be configured to model three-dimensional rock chips for each cutting element, if a depth of cut of at least one cutlet associated with the cutting element is greater than a critical depth of cut, e.g., critical depth of cut 910 (FIG. 9). For example, a two-dimensional model of a rock chip associated with each cutlet may be calculated, such as modeled rock chip 808. In some embodiments, each two-dimensional rock chip may include a rock chip angle ($\psi$), e.g., rock chip angle 820 (FIG. 8) and a rock chip length (such as rock chip lengths 906a-906k of FIG. 9). In some embodiments, a single rock chip angle ($\psi$) may be determined based on rock shear strength, drilling pressure, rock failure mode, porosity, rock strength, density, or any other suitable drilling parameters, or formation property.

Modeling system module 1102 may be further configured to cause processor 1104 to update a three-dimensional model of the borehole bottom by removing each of the three-dimensional rock chip models from the surrounding geologic formation. For example, modeling system module 1102 may be configured to determine a rock chip boundary for each of the three-dimensional rock chip models, e.g., rock chip boundary 1018 (FIG. 10). In some embodiments, a rock chip boundary may include an area bounded by a cutting face of a cutting element and a rock chip length associated with two-dimensional models of rock chips associated with cutlets of a cutting element, e.g., area 1020 (FIG. 10). Further, modeling system module 1102 may be configured to assign updated depths to a modeled borehole bottom for each coordinate grid point within each rock chip boundary, as previously discussed with reference to FIG. 10.

In some embodiments, modeling system module 1102 may be configured to estimate the size and shape of rock chips generated by a drill bit in operation, and to categorize and determine a distribution of the rock chips. For example, the modeling system 1102 may determine a percentage of the rock chips that fall within any number of predetermined ranges of various properties of the rock chip models, e.g., chip length, chip height, volume, weight, shape and/or chip angle. Further, modeling system module 1102 may be configured to determine or estimate a distribution of rock chips for multiple instances drill bit designs 1110a-1110c, where each instance of drill bit design 1110a-1110c is modeled based on a particular set of rock property parameters 1114a-1114c. Modeling system module 1102 may also be configured to determine a rock chip distribution for a drilling operation with a particular instance of drill bit design 1110a-1110c, based on a various different instances of rock property parameters 1114a-1114c. In embodiments where modeling system module 1102 is configured to model more than one drill bit design-rock property combination, modeling system module 1102 may be further configured to indicate or select a drill bit design that may operate to generate a desired rock chip distribution. In some embodiments, modeling system module 1102 may be configured to rank or order drill bit designs by the ability to achieve a desired rock chip distribution.

Modeling system module 1102 may be communicatively coupled to various data receivers 1116. The data receivers 1116 may include displays such that information processed by modeling system module 1102 (e.g., the size and shape of rock chips and/or the rock chip distribution) may be conveyed to operators of drilling equipment. The data receivers 1116 may also include other computational analysis tools (e.g., computational fluid dynamics modeling tools) to model or simulate other aspects of a drilling operation. For example, the data receivers 1116 may receive the size, shape, quantity and rock chip distribution, and analyze or optimize mud flow for removing the rock chips from the borehole.

Modifications, additions, or omissions may be made to FIG. 11 without departing from the scope of the present disclosure. For example, FIG. 11 shows a particular configuration of components of modeling system 1100. However, any suitable configurations of components may be used. For example, components of modeling system 1100 may be implemented either as physical or logical components. Furthermore, in some embodiments, functionality associated with components of modeling system 1100 may be implemented in special purpose circuits or components. In other embodiments, functionality associated with components of modeling system 1100 may be implemented in configurable general purpose circuit or components. For example, components of modeling system 1100 may be implemented by configure computer program instructions.

Figure 12:
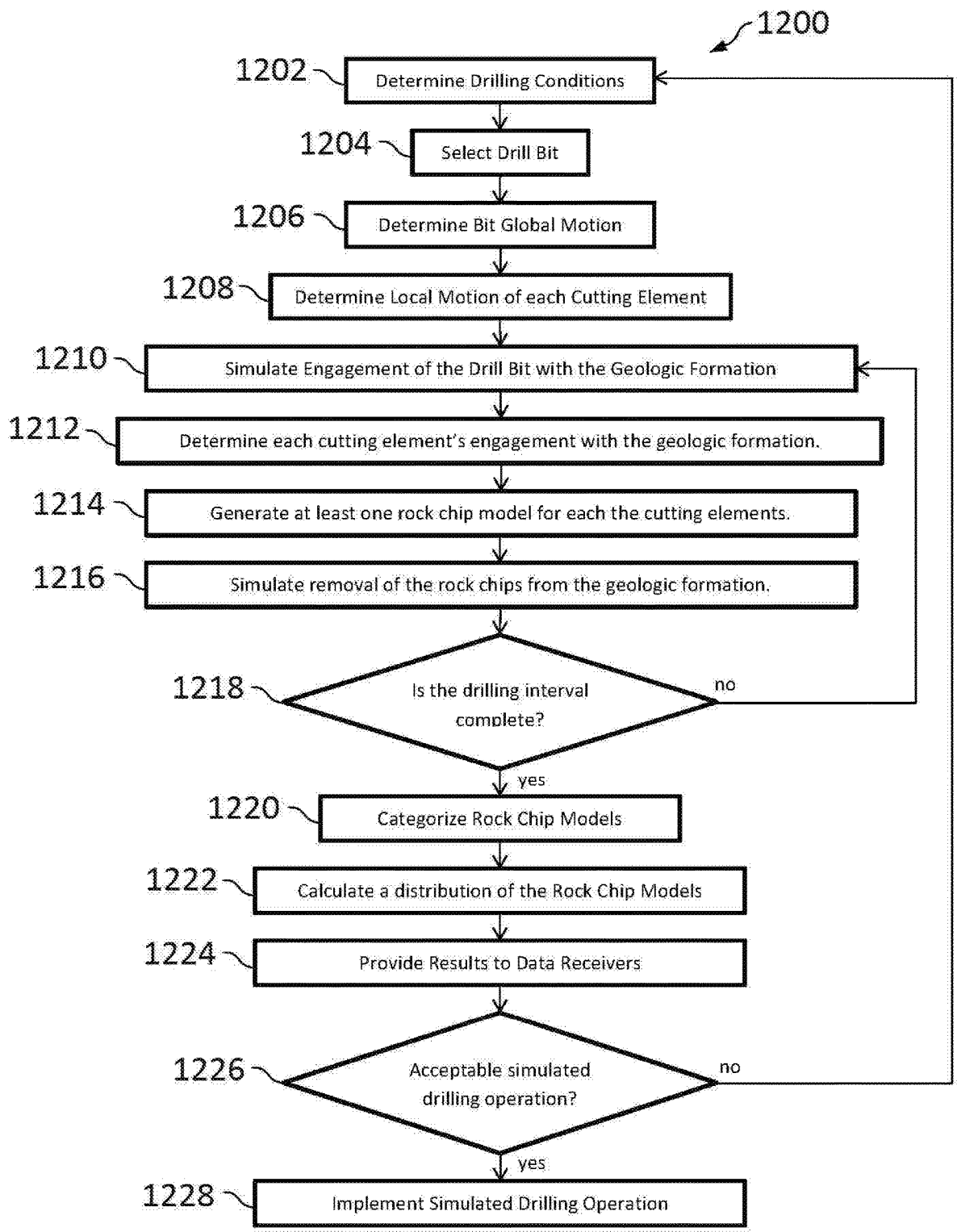
FIG. 12 is a flow chart illustrating a procedure for analyzing a downhole drilling operation including modeling and predicting the size and shape of rock chips generated in the drilling operation.

FIG. 12 is a flow chart illustrating a procedure or method 1200 for analyzing a downhole drilling operation, which includes modeling and predicting the size and shape of rock chips generated by the drilling operation. The steps of the method 1200 may be performed by various computer programs, models or any combination thereof, configured to simulate and design drilling systems, apparatuses, devices and operations. For example, in some embodiments, the steps of method 1200 may be performed by modeling system 1100, discussed above with reference to FIG. 11. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs, models, or systems used to simulate and design drilling systems may be referred to as a "modeling system."

Method 1200 may begin at step 1202 where the parameters of the drilling operation to be simulated are determined or defined. For example, a desired RPM, ROP, WOB, build rate walk rate rock strength and rock type may be determined. These operational parameters or drilling conditions may be input into modeling system 1100 manually and/or selected from the appropriate databases, e.g., rock property database 1112. A model of a borehole may be generated by the modeling system 1100 to include the rock properties and any other relevant operational parameters. In some embodiments, these desired operational parameters may be known, and in others embodiments, these parameters may be estimated or selected for verification by the method 1200.

Next, at step 1204, a drill bit is selected for the drilling operation. A drill bit model of the selected drill bit may be identified for use by the modeling system 1100, and the modeling system module 1102 may import the drill bit model from the drill bit database 1108. The imported drill bit model may include the relevant drill bit design, e.g., designs 1110a-1110c, including all relevant geometry. In some embodiments, a design of a drill bit may include a representation of a configuration of blades and cutting elements, such as those shown in FIGS. 1 and 2. Further, a design of a drill bit may include coordinate locations of each of the cutting elements with reference to a bit rotational axis. Coordinate locations may be implemented in polar. Cartesian, or spherical coordinate systems. A position of a plurality of cutting elements, e.g., cutting element 128 (FIG. 2), on the selected drill bit model may be determined. For example, the modeling system 1100 may identify a position of a cutting element, as a radial distance from a rotational axis, e.g., radial coordinate $R_{504}$ (FIG. 5), and an angular coordinate, e.g., angular coordinate $\theta_{054}$ (FIG. 5).

At step 1206, a global motion of the selected drill bit may be determined from the operational parameters discussed above, e.g., RPM and/or ROP. From the global motion of the drill bit, and from the position of the cutting elements on the drill bit, a local motion for each of the cutting elements may be determined (step 1208).

At step 1210, the modeling system 1100 may simulate an engagement of the selected drill bit with the geologic formation. For example, the modeling system 1100 may simulate the global motion of the drill bit model within the model of the borehole. For example, the modeling system 1100 may create an initial borehole bottom model by simulating a full revolution of the drill bit design with ROP equal to zero. Subsequently, the modeling system may model a non-zero ROP, e.g., the ROP determined in step 1102. The modeling system 1100 may simulate the engagement of the drill bit with the geologic formation by incrementally rotating the drill bit model around an associated rotational axis.

At step 1212, each cutting element's engagement with the geologic formation is determined including a depth of cut based on the position of each individual cutting element on the drill bit model. To determine a depth of cut associated with an individual cutting element, the modeling system 1100 may identify a location of a cutlet on the individual cutting element. For example, cutlets may be associated with discrete points along a cutting edge of the cutting element, e.g., cutlets 606a-606c (FIG. 6). Further, the modeling system 1100 may identify the coordinates of the location of the cutlet, including a radial distance from a rotational axis, e.g., radial coordinate $R_{504}$ (FIG. 5), and an angular coordinate, e.g., angular coordinate $\theta_{504}$ (FIG. 5). A depth of cut (Δ) may then be determined by the modeling system for each cutlet. A depth of cut may include a distance between a surface of a formation and a cutting edge of a cutting element, e.g., modeled depth of cut 814 (FIG. 8). The depth of cut may depend on drilling parameters such as RPM. ROP, confining pressure, mud pressure, or on formation parameters such as rock shear strength, rock failure mode, or any other suitable drilling parameter or formation property.

At step 1214, the modeling system 1100 may generate a rock chip model in response to the depth of cut determined in step 1212. For example, the modeling system 1100 may calculate a size of a two-dimensional rock chip for each cutlet. If the depth of cut for a particular cutlet is less than a critical depth of cut. e.g., the depth of cut associated with cutlet 904a (FIG. 9), no two-dimensional rock chip will be generated (i.e., the size of the two-dimensional rock chip associated with that particular cutlet is zero). If the depth of cut for a particular cutlet is greater than a critical depth of cut, e.g., depth of cut associated with cutlet 904e (FIG. 9), a rock chip will be generated. The size of a rock chip may be determined according to a depth of cut (Δ) and a chip angle (ψ), for example rock chip angle 820 of FIG. 8. A two-dimensional rock chip may be modeled as having a straight crack trajectory, such as crack trajectory 818 to simplify rock chip computations. The modeling system 1100 may model rock chips associated with cutlets as parallel to the cutting direction, e.g., rock chip lengths 1008a-1008d (FIG. 10). Once each cutlet for a cutting element has been considered and the size of a 2-dimensional rock chip for each cutlet has been determined, the modeling system 1100 may combine each of the 2-dimensional rock chips to form a three-dimensional rock chip model. A three dimensional-rock chip model for each of the cutting elements on the drill bit may be generated, and the size and shape of each rock chip may be determined and stored by the modeling system 1100, e.g., within the memory 1106.

At step 1216, the modeling system may remove the three-dimensional rock chip models from the geologic formation in the model of the borehole. The modeling system 1100 may identify a rock chip boundary that encompasses the cutting element cutting face and the lengths of the 2-dimensional rock chips. Further, the modeling system may update a borehole bottom depth for a set of points within the rock chip boundary. In this manner, a volume of the geologic formation consistent with the rock chip models generated may be removed to update the model of the borehole.

The method 1200 may then proceed to decision 1218 where it is determined whether a predetermined drilling interval is complete. In some embodiments, the drilling interval may include a desired number of drill bit rotations or a desired depth to be achieved. If the drilling interval is not complete, the method 1200 may return to step 1210 and the engagement of the drill bit with an updated model of the borehole may be simulated. The simulated engagement of the drill bit with the borehole, and the simulated removal of rock chips may be continued or reiterated for the duration of any desired or predetermined drilling interval. In some embodiments, the model of the borehole generated includes a first portion and a second portion of the geologic formation to be drilled through during the predetermined drilling interval. In some embodiments, the first portion of the geologic formation is modeled to be softer than the second portion of the geologic formation. When the drilling interval is complete, the method 1200 may proceed to step 1220.

At step 1220, the modeling system 1100 may categorize each of the rock chip models (2-dimendional or three-dimensional) generated over the drilling interval according to at least one property of the rock chip models. For example, the rock chip models may be categorized according to chip length, chip height, volume, weight, shape, and modeled rock chip angle. The modeling system 1100 may place each of the rock chips into a category defined by a plurality of ranges associated with the property of the chip models. For example, the modeling system may place all rock chips having a volume greater than a predetermined threshold volume into a category of "large" three-dimensional rock chip models, and each of the rock chip models having a volume less than the predetermined threshold volume into a category of "small" rock chips. In other embodiments, the rock chips may be categorized into any number of discrete ranges, e.g., ten or more discrete ranges of the property of the rock chip models. In some embodiments, each rock chip model may be categorized into its own discrete category. For example, if each rock chip is associated with a distinct or discrete volume, a category for only that volume may be defined by the modeling system 1100.

At step 1222, the modeling system 1100 may calculate a distribution of the rock chips based on the categorizing of the rock chips. For example, the modeling system may determine a relative number of rock chips in each category. In some embodiments, the distribution may be a percentage of the rock chip models falling into each category, e.g. 80% "small" rock chips and 20% large rock chips. In other embodiments, the distribution may be a bell curve (or other pattern) generated by plotting the frequency of the generation of rock chips falling into each category.

At step 1224, the modeling system 1100 may provide data representative of the size, shape, and quantity rock chip models generated to the data receivers 1116. In some embodiments, the data receivers 1116 may be a fluid dynamics modeling program, which may produce a fluid dynamics model of the borehole. The fluid dynamics modeling program may characterize a sufficient mud flow (flow rate, mud type, etc.) for removing the distribution of rock chips from the borehole. In other embodiments, the data receivers 1116 may be a monitor that operator may view to determine (according to any desired criteria) whether an acceptable rock chip distribution and/or drilling operation has been simulated (decision 1226).

If an acceptable drilling operation has not been achieved, the procedure may return to step 1202 where at least one parameter or variable of the drilling operation may be changed, and/or a different drill bit may be selected for the drilling operation. For example, if an unacceptable distribution of rock chip models is produced by the simulation, at least one bit design parameter (e.g., cutter size, cutter density, cutter distribution and number of blades) may be selected based on a desired distribution of rock chip models, and the simulation may proceed with the updated bit design parameter. If an acceptable drilling operation has been achieved, including an appropriate distribution of rock chips, the procedure may proceed to step 1228 where at least a portion of the simulated drilling operation may be implemented. For example, a drill bit selected to provide the desired rock chip distribution may be used in a drilling system 100 (FIG. 1) to drill a wellbore.

Modifications, additions or omissions may be made to method 1200 without departing from the scope of the disclosure. Although the present disclosure has been described with several embodiments, various changes and modifications may be suggested to one skilled in the art. For example, although the present disclosure describes the configurations of cutting elements with respect to drill bits, the same principles may be used to model the efficiency of any suitable drilling tool according to the present disclosure. It is intended that the present disclosure encompasses such changes and modifications as fall within the scope of the appended claims.

The aspects of the disclosure described below are provided to describe a selection of concepts in a simplified form that are described in greater detail above. This section is not intended to identify key features or essential features of the claimed subject matter, nor is it intended to be used as an aid in determining the scope of the claimed subject matter.

In one aspect, the disclosure is directed to a method of analyzing a downhole drilling operation. The method includes (a) generating a model of a borehole extending into a geologic formation, (b) determining a respective position for each of a plurality of cutting elements on a drill bit model, (c) simulating an engagement of the drill bit model with the model of the borehole, (d) calculating a depth of cut associated with each of the cutting elements based on the respective positions of the cutting elements on the drill bit model, (e) generating a rock chip model for each cutting element in response to the depth of cut associated with the cutting element being greater than a critical depth of cut, (f) categorizing each of the rock chip models generated into predefined categories according to at least one property of the rock chip models, and (g) calculating a distribution of the rock chip models among the predefined categories based on the categorizing of the rock chip models by determining a relative number of rock chips in each predefined category.

In one or more embodiments, generating a rock chip model for each cutting element comprises generating a three-dimensional rock chip model for each cutting element based on a plurality of two-dimensional rock chip models respectively associated with a plurality of cutlets defined along the cutting element. Categorizing each of the rock chip models may include defining a plurality of ranges associated with the property of the three-dimensional models, and the property may be selected from the group consisting of chip length, chip height, volume, weight, shape, and modeled rock chip angle. In some embodiments, the method further includes producing a fluid dynamics model of mud flow in the model of the borehole, and characterizing a sufficient mud flow for removing the distribution of rock chips from the borehole. In some embodiments, the method further includes updating the model of the borehole by removing a volume of the geologic formation consistent with the rock chip models generated. Updating the model of the borehole may further include determining a rock chip boundary for each of the three-dimensional rock chip models disposed on a borehole bottom, and assigning an updated depth of the borehole bottom for each point within the rock chip boundary.

In some example embodiments, the method further includes selecting at least one bit design parameter based on a desired distribution of the rock chip models, the at least one bit design parameter including at least one of the group consisting of cutter size, cutter density, cutter distribution and number of blades. Calculating a distribution of the rock chip models may include calculating the distribution of the rock chip models over a predetermined drilling interval. In one or more embodiments, generating the model of a borehole includes modeling a first portion and a second portion of the geologic formation to be drilled through during the predetermined drilling interval, and the first portion of the geologic formation is modeled to be softer than the second portion of the geologic formation. In some embodiments, the method further comprising determining a global motion for the drill bit model and determining a local motion of each of the plurality of cutting elements based on the global motion of the drill bit.

In another aspect, the disclosure is directed to a non-transitory machine readable medium comprising instructions stored therein. The instructions are executable by one or more processors to facilitate performing a method of analyzing a downhole drilling operation. The method includes (a) generating a model of a borehole extending into a geologic formation, (b) determining a respective position for each of a plurality of cutting elements on a drill bit model, (c) simulating an engagement of the drill bit model with the model of the borehole, (d) calculating a depth of cut associated with each of the cutting elements based on the respective positions of the cutting elements on the drill bit model, (e) generating a rock chip model for each cutting element in response to the depth of cut associated with the cutting element being greater than a critical depth of cut, (f) categorizing each of the rock chip models generated into predefined categories defined according to at least one property of the rock chip models, and (g) calculating a distribution of the rock chip models among the predefined categories based on the categorizing of the rock chip models by determining a relative number of rock chips in each predefined category.

In one or more example embodiments, the instructions may further facilitate receiving drilling conditions as inputs, the drilling conditions including at least one of the group consisting of RPM, ROP, WOB, build rate, walk rate, rock strength and rock type. The method facilitated by the instructions stored on the non-transitory machine readable medium may further include generating a plurality of two-dimensional rock chip models respectively associated with a plurality of cutlets defined along each of the plurality of cutting elements. In some embodiments, the two-dimensional rock chip models have a triangular shape triangular shape with a rock chip boundary defining a straight line between the respective cutlet and a rock chip end defined at a surface of the geologic formation exposed within the model of the borehole.

In one or more example embodiments, the method facilitated by the instructions stored on the non-transitory machine readable medium may further include generating a three-dimensional rock chip model for each cutting element based on a plurality of two-dimensional rock chip models respectively associated with a plurality of cutlets defined along the cutting element. In the method facilitated by the instructions stored on the non-transitory machine readable medium, categorizing each of the rock chip models may include defining a plurality of ranges associated with the property of the three-dimensional models, and the property may be selected from the group consisting of chip length, chip height, volume, weight, shape, and modeled rock chip angle. In some embodiments, the method facilitated by the instructions stored on the non-transitory machine readable medium may further include producing a fluid dynamics model of mud flow in the model of the borehole, and characterizing a sufficient mud flow for removing the distribution of rock chips from the borehole. In some embodiments, the method facilitated by the instructions stored on the non-transitory machine readable medium may further include updating the model of the borehole by removing a volume of the geologic formation consistent with the rock chip models generated. In the method facilitated by the instructions stored on the non-transitory machine readable medium, updating the model of the borehole may further include determining a rock chip boundary for each of the three-dimensional rock chip models disposed on a borehole bottom, and assigning an updated depth of the borehole bottom for each point within the rock chip boundary.

In some example embodiments, the method facilitated by the instructions stored on the non-transitory machine readable medium further includes selecting at least one bit design parameter based on a desired distribution of the rock chip models, the at least one bit design parameter including at least one of the group consisting of cutter size, cutter density, cutter distribution and number of blades. In the method facilitated by the instructions stored on the non-transitory machine readable medium, calculating a distribution of the rock chip models may include calculating the distribution of the rock chip models over a predetermined drilling interval. In one or more embodiments, generating the model of a borehole in the method facilitated by the instructions stored on the non-transitory machine readable medium includes modeling a first portion and a second portion of the geologic formation to be drilled through during the predetermined drilling interval, and the first portion of the geologic formation is modeled to be softer than the second portion of the geologic formation. In some embodiments, the method facilitated by the instructions stored on the non-transitory machine readable medium further comprising determining a global motion for the drill bit model and determining a local motion of each of the plurality of cutting elements based on the global motion of the drill bit.

According to another aspect, the disclosure is directed to a modeling system for simulating a downhole drilling operation. The system includes a processor and a memory communicatively coupled to the processor with computer program instructions stored therein, the instructions configured to, when executed by the processor to: (a) generate a model of a borehole extending into a geologic formation, (b) determine a respective position for each of a plurality of cutting elements on a drill bit model, (c) simulate an engagement the drill bit model with the model of the borehole (d) calculate a depth of cut associated with each of the cutting elements based on the respective positions of the cutting elements on the drill bit model (e) generate a rock chip model for each cutting element in response to the depth of cut associated with the cutting element being greater than a critical depth of cut, (f) categorize each of the rock chip models generated into predefined categories defined according to at least one property of the rock chip models, and (g) calculate a distribution of the rock chip models among the predefined categories based on the categorizing of the rock chop models by determining a relative number of rock chips in each category.

According to some embodiments, the modeling system further includes a bit design database and a rock property database communicatively coupled to the processor. In some embodiments, the memory includes instructions stored therein configured to, when executed by the processor of the modeling system, receive drilling conditions as inputs, the drilling conditions including at least one of the group consisting of RPM, ROP, WOB, build rate, walk rate, rock strength and rock type. In some embodiments, the memory includes instructions stored therein configured to, when executed by the processor of the modeling system, receive generate a plurality of two-dimensional rock chip models respectively associated with a plurality of cutlets defined along each of the plurality of cutting elements. In some embodiments, the two-dimensional rock chip models have a triangular shape triangular shape with a rock chip boundary defining a straight line between the respective cutlet and a rock chip end defined at a surface of the geologic formation exposed within the model of the borehole.

In one or more example embodiments, the memory includes instructions stored therein configured to, when executed by the processor of the modeling system, generate a three-dimensional rock chip model for each cutting element based on a plurality of two-dimensional rock chip models respectively associated with a plurality of cutlets defined along the cutting element. The memory may include instructions stored therein configured to, when executed by the processor of the modeling system, categorize each of the rock chip models by defining a plurality of ranges associated with the property of the three-dimensional models, and selecting the property from the group consisting of chip length, chip height, volume, weight, shape, and modeled rock chip angle. In some embodiments, the memory includes instructions stored therein configured to, when executed by the processor of the modeling system, produce a fluid dynamics model of mud flow in the model of the borehole, and characterizing a sufficient mud flow for removing the distribution of rock chips from the borehole. In some embodiments, the memory includes instructions stored therein configured to, when executed by the processor of the modeling system, update the model of the borehole by removing a volume of the geologic formation consistent with the rock chip models generated. In some embodiments, in the memory includes instructions stored therein configured to, when executed by the processor of the modeling system, update the model of the borehole by determining a rock chip boundary for each of the three-dimensional rock chip models disposed on a borehole bottom, and assigning an updated depth of the borehole bottom for each point within the rock chip boundary.

In some example embodiments, the memory includes instructions stored therein configured to, when executed by the processor of the modeling system, select at least one bit design parameter based on a desired distribution of the rock chip models, the at least one bit design parameter including at least one of the group consisting of cutter size, cutter density, cutter distribution and number of blades. In some embodiments, the memory includes instructions stored therein configured to, when executed by the processor of the modeling system, calculate a distribution of the rock chip models may include calculating the distribution of the rock chip models over a predetermined drilling interval. In some embodiments, the memory includes instructions stored therein configured to, when executed by the processor of the modeling system, generate the model of a borehole by modeling a first portion and a second portion of the geologic formation to be drilled through during the predetermined drilling interval, wherein and the first portion of the geologic formation is modeled to be softer than the second portion of the geologic formation. In some embodiments, the memory includes instructions stored therein configured to, when executed by the processor of the modeling system, determine a global motion for the drill bit model and determining a local motion of each of the plurality of cutting elements based on the global motion of the drill bit.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B. and C" or "at least one of A. B, or C" each refer to only A, only B, or only C; any combination of A, B. and C; and/or at least one of each of A. B, and C.

The Abstract of the disclosure is solely for providing the United States Patent and Trademark Office and the public at large with a way by which to determine quickly from a cursory reading the nature and gist of technical disclosure, and it represents solely one or more examples.

While various examples have been illustrated in detail, the disclosure is not limited to the examples shown. Modifications and adaptations of the above examples may occur to those skilled in the art. Such modifications and adaptations are in the scope of the disclosure.

What is claimed is:

1. A method of analyzing a downhole drilling operation, the method comprising:
   generating a model of a borehole extending into a geologic formation;
   determining a respective position for each of a plurality of cutting elements on a drill bit model;
   simulating an engagement of the drill bit model with the model of the borehole;
   calculating a depth of cut associated with each of the cutting elements based on the respective positions of the cutting elements on the drill bit model;
   generating a rock chip model for each cutting element in response to the depth of cut associated with the cutting element being greater than a critical depth of cut;

categorizing each of the rock chip models generated into predefined categories defined according to at least one property of the rock chip models; and calculating a distribution of the rock chip models among the predefined categories based on the categorizing of the rock chip models by determining a relative number of rock chips in each predefined category, wherein calculating a distribution of the rock chip models includes calculating the distribution of the rock chip models over a predetermined drilling interval.

2. The method according to claim 1, wherein generating a rock chip model for each cutting element comprises generating a three-dimensional rock chip model for each cutting element based on a plurality of two-dimensional rock chip models respectively associated with a plurality of cutlets defined along the cutting element.

3. The method according to claim 2, wherein categorizing each of the rock chip models includes defining a plurality of ranges associated with the property of the three-dimensional models, and wherein the property is selected from the group consisting of chip length, chip height, volume, weight, shape, and modeled rock chip angle.

4. The method according to claim 3, further comprising producing a fluid dynamics model of mud flow in the model of the borehole, and characterizing a sufficient mud flow for removing the distribution of rock chips from the borehole.

5. The method according to claim 4, further comprising updating the model of the borehole by removing a volume of the geologic formation consistent with the rock chip models generated.

6. The method according to claim 5, wherein updating the model of the borehole further comprises determining a rock chip boundary for each of the three-dimensional rock chip models disposed on a borehole bottom, and assigning an updated depth of the borehole bottom for each point within the rock chip boundary.

7. The method according to claim 1, further comprising selecting at least one bit design parameter based on a desired distribution of the rock chip models, the at least one bit design parameter including at least one of the group consisting of cutter size, cutter density, cutter distribution and number of blades.

8. The method according to claim 1, wherein generating the model of a borehole includes modeling a first portion and a second portion of the geologic formation to be drilled through during the predetermined drilling interval, and wherein the first portion of the geologic formation is modeled to be softer than the second portion of the geologic formation.

9. The method according to claim 1, further comprising determining a global motion for the drill bit model and determining a local motion of each of the plurality of cutting elements based on the global motion of the drill bit.

10. The method according to claim 9, further comprising defining operational parameters of the downhole drilling operation including a desired RPM, ROP or build rate and wherein the global motion of the drill bit model is determined from the operational parameters.

11. The method according to claim 1, wherein the predetermined drilling interval includes a desired number of drill bit rotations or a desired depth to be achieved.

12. The method according to claim 1, further comprising estimating the critical depth of cut by determining at chip height below a mean chip height of measured chip heights.

13. The method according to claim 1, wherein the predetermined categories include categories of modeled rock chip volume.

14. The method according to claim 13, wherein the predetermined categories include a category of large rock chip models having a volume greater than a predetermined threshold volume and a category of small rock chip models having a volume less than the predetermined threshold volume.

15. A non-transitory machine readable medium comprising instructions stored therein, the instructions executable by one or more processors to facilitate performing a method of analyzing a downhole drilling operation, the method comprising:

generating a model of a borehole extending into a geologic formation;

determining a respective position for each of a plurality of cutting elements on a drill bit model;

simulating an engagement of the drill bit model with the model of the borehole;

calculating a depth of cut associated with each of the cutting elements based on the respective positions of the cutting elements on the drill bit model;

generating a rock chip model for each cutting element in response to the depth of cut associated with the cutting element being greater than a critical depth of cut;

categorizing each of the rock chip models generated into predefined categories defined according to at least one property of the rock chip models; and calculating a distribution of the rock chip models among the predefined categories based on the categorizing of the rock chip models by determining a relative number of rock chips in each predefined category, wherein calculating a distribution of the rock chip models includes calculating the distribution of the rock chip models over a predetermined drilling interval.

16. The non-transitory machine readable medium of claim 15, wherein the instructions further facilitate receiving drilling conditions as inputs, the drilling conditions including at least one of the group consisting of RPM, ROP, WOB, build rate, walk rate, rock strength and rock type.

17. The non-transitory machine readable medium of claim 15, wherein the method further comprises generating a plurality of two-dimensional rock chip models respectively associated with a plurality of cutlets defined along each of the plurality of cutting elements.

18. The non-transitory machine readable medium of claim 17, wherein the two-dimensional rock chip models have a triangular shape with a rock chip boundary defining a straight line between the respective cutlet and a rock chip end defined at a surface of the geologic formation exposed within the model of the borehole.

19. A modeling system for simulating a downhole drilling operation, the system comprising:

a processor;

a memory communicatively coupled to the processor with computer program instructions stored therein, the instructions configured to, when executed by the processor to:

generate a model of a borehole extending into a geologic formation;

determine a respective position for each of a plurality of cutting elements on a drill bit model;

determine a global motion for the drill bit model;

determine a local motion of each of the plurality of cutting elements based on the global motion of the drill bit model;

simulate an engagement the drill bit model with the model of the borehole;

calculate a depth of cut associated with each of the cutting elements based on the respective positions of the cutting elements on the drill bit model;

generate a rock chip model for each cutting element in response to the depth of cut associated with the cutting element being greater than a critical depth of cut;

categorize each of the rock chip models generated into predefined categories defined according to at least one property of the rock chip models; and calculate a distribution of the rock chip models among the predefined categories based on the categorizing of the rock chip models by determining a relative number of rock chips in each category.

20. The modeling system according to claim 19, further comprising a bit design database and a rock property database communicatively coupled to the processor.

* * * * *